United States Patent
Tsai et al.

(10) Patent No.: US 7,924,967 B2
(45) Date of Patent: Apr. 12, 2011

(54) SHIFT REGISTER

(75) Inventors: Tsung-Ting Tsai, Hsinchu (TW);
Ming-Sheng Lai, Hsinchu (TW);
Min-Feng Chiang, Hsinchu (TW);
Po-Yuan Liu, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 0 days.

(21) Appl. No.: 12/877,748

(22) Filed: Sep. 8, 2010

(65) Prior Publication Data
US 2011/0007863 A1    Jan. 13, 2011

Related U.S. Application Data

(62) Division of application No. 12/334,874, filed on Dec. 15, 2008, now Pat. No. 7,817,771.

(51) Int. Cl.
*G11C 19/00* (2006.01)
(52) U.S. Cl. ............ 377/64; 377/68; 377/69; 377/78; 377/79
(58) Field of Classification Search .......... 377/64, 377/68, 69–74, 77–81
See application file for complete search history.

(56) References Cited

U.S. PATENT DOCUMENTS

| | | | | |
|---|---|---|---|---|
| 7,400,698 B2 * | 7/2008 | Chang et al. | | 377/64 |
| 7,450,681 B2 * | 11/2008 | Wei et al. | | 377/64 |
| 7,627,077 B2 * | 12/2009 | Wei et al. | | 377/64 |
| 7,778,379 B2 * | 8/2010 | Liao et al. | | 377/64 |
| 2007/0086558 A1 * | 4/2007 | Wei et al. | | 377/64 |
| 2007/0104307 A1 | 5/2007 | Kim et al. | | |
| 2007/0217563 A1 * | 9/2007 | Chang et al. | | 377/64 |
| 2007/0290982 A1 | 12/2007 | Kim et al. | | |
| 2008/0055293 A1 * | 3/2008 | Kuo et al. | | 345/204 |

* cited by examiner

*Primary Examiner* — Tuan Lam
(74) *Attorney, Agent, or Firm* — Tim Tingkang Xia; Morris, Manning & Martin, LLP

(57) ABSTRACT

A shift register comprises a plurality of stages, $\{S_n\}$, n=1, 2, ..., N, N being a positive integer. In one embodiment, each stage $S_n$ includes a pull-up circuit having an input for receiving one of a first clock signal, CK1, and a second clock signal, XCK1, an output for responsively outputting an output signal, $O_n$, and an input node $Q_n$, a pull-up control circuit electrically coupled to the input node $Q_n$ and configured such that when receiving a first input signal, the pull-up control circuit responsively generates a signal that is provided to the input node $Q_n$ to turn on the pull-up circuit, a pull-down circuit electrically coupled to the input node $Q_n$ and configured to provide a first voltage to one of the input node $Q_n$ and the output of the pull-up circuit, and a pull-down control circuit configured to receive one of a third clock signal, CK2, and a fourth clock signal, XCK2, and responsively generate the first voltage to turn on the pull-down circuit of the stage $S_n$ and the pull-down circuit of one of the stage $S_{n-1}$ and the stage $S_{n+1}$.

8 Claims, 20 Drawing Sheets

US 7,924,967 B2

SHIFT REGISTER

CROSS-REFERENCE TO RELATED PATENT APPLICATION

This application is a divisional application of, and claims benefit of U.S. patent application Ser. No. 12/334,874, filed Dec. 15, 2008 now U.S. Pat. No. 7,817,771, entitled "A SHIFT REGISTER," by Tsung-Ting Tsai et al, which status is allowed, the disclosure of which is hereby incorporated herein in its entirety by reference.

FIELD OF THE INVENTION

The present invention relates generally to a shift register, and in particular to a shift register having a plurality of stages with each pair of stages sharing a single pull-down control circuit.

BACKGROUND OF THE INVENTION

A liquid crystal display (LCD) includes an LCD panel formed with liquid crystal cells and pixel elements with each associating with a corresponding liquid crystal cell. These pixel elements are substantially arranged in the form of a matrix having gate lines in rows and data lines in columns. The LCD panel is driven by a driving circuit including a gate driver and a data driver. The gate driver generates a plurality of gate signals (scanning signals) sequentially applied to the gate lines for sequentially turning on the pixel elements row-by-row. The data driver generates a plurality of source signals (data signals), i.e., sequentially sampling image signals, simultaneously applied to the data lines in conjunction with the gate signals applied to the gate lines for aligning states of the liquid crystal cells on the LCD panel to control light transmittance therethrough, thereby displaying an image on the LCD.

In such a driving circuit, a shift register is utilized in the gate driver to generate the plurality of gate signals for sequentially driving the gate lines. To lower down costs, there have been efforts to integrate the shift register and the gate driver into an LCD panel. One of the efforts, for example, is to fabricate the shift register and the gate driver on a glass substrate of the LCD panel, namely, the gate on array (GOA) arrangement, using amorphous silicon (a-Si) thin film transistors (TFTs), and/or low temperature polycrystalline silicon (LTPS) TFTs.

Generally, a shift register having multiple stages is designed such that in operation there are some TFTs that are turned on for a long period of time for the purpose of discharges. Additionally, such a shift register is usually supplied with two or more clock signals to substantially shift an output signal of a stage from its input signal that is an output signal of its immediately prior stage, thereby generating of a plurality of sequentially shifted output signals. If the two or more clock signals have a same frequency that is very high, some TFTs in the shift register may frequently be turned on during operation. However, when voltages are continually or frequently applied to TFTs made from a-Si and/or LTPS material for a long period of time, the characteristics of the TFTs may deteriorate due to stress thereon and thus the TFTs may not function properly, thereby reducing the reliability of the shift register. For the shift register operating reliably and normally, a plurality of pull-down circuit sets is applied to reduce the stress. This makes the GOA design of an LCD panel very complicate.

Therefore, a heretofore unaddressed need exists in the art to address the aforementioned deficiencies and inadequacies.

SUMMARY OF THE INVENTION

The present invention, in one aspect, relates to a shift register. In one embodiment, the shift register includes a plurality of stages, $\{S_n\}$, n=1, 2, ..., N, N being a positive integer. Each stage $S_n$ comprises a first input, IN1, for receiving one of a first clock signal, CK1, and a second clock signal, XCK1, a second input, IN2, for receiving a third clock signal, CK2, if the first input IN1 receives the first clock signal CK1, or a fourth clock signal, XCK2, if the first input IN1 receives the second clock signal XCK1, a third input, IN3, for receiving a supply voltage, VSS, a fourth input, IN4, a fifth input, IN5, a sixth input, IN6, a seventh input, IN7, and an eighth input, IN8.

Furthermore, each stage $S_n$ comprises a first output, OUT1, for outputting an output signal, $O_n$, and a second output, OUT2, for outputting a pull-down signal, $K_n$.

Moreover, each stage $S_n$ comprises a pull-up circuit electrically coupled between the first input IN1 and the first output OUT1, a pull-up control circuit electrically coupled between the fifth inputs IN5 and the pull-up circuit, a first pull-down circuit electrically coupled to the pull-up circuit, a first pull-down control circuit electrically coupled to the second input IN2, the second output OUT2, and the first pull-down circuit, a second pull-down circuit electrically coupled to the fourth input IN4, the first pull-down control circuit and the pull-up circuit; and a third pull-down circuit electrically coupled to the sixth input IN6, and the second pull-down circuit and the pull-up circuit.

The plurality of stages $\{S_n\}$ is electrically coupled in serial. In such an arrangement, the fourth input IN4 of the n-th stage $S_n$ is electrically coupled to the second output OUT2 of the (n−1)-th stage $S_{n-1}$, for receiving a corresponding pull-down output signal $K_{n-1}$ therefrom, or the second output OUT2 of the (n+1)-th stage $S_{n+1}$, for receiving a corresponding pull-down output signal $K_{n+1}$ therefrom. The fifth input IN5 of the n-th stage $S_n$ is electrically coupled to the first output OUT1 of the (n−1)-th stage $S_{n-1}$, for receiving a corresponding output signal $O_{n-1}$ therefrom. The sixth input IN6 of the n-th stage $S_n$ is electrically coupled to the first output OUT1 of the (n+1)-th stage $S_{n+1}$, for receiving a corresponding output signal $O_{n+1}$ therefrom. The seventh input IN7 of the n-th stage $S_n$ is electrically coupled to the first output OUT1 of the (n+2)-th stage $S_{n+2}$, for receiving a corresponding output signal $O_{n+2}$ therefrom. The eighth input IN8 of the n-th stage $S_n$ is electrically coupled to the first output OUT1 of the (n−2)-th stage $S_{n-2}$, for receiving a corresponding output signal $O_{n-2}$ therefrom.

Additionally, the shift register also has a first clock signal line for providing the first clock signal, CK1, a second clock signal line for providing the second clock signal, XCK2, a third clock signal line for providing the third clock signal, CK1, a fourth clock signal line for providing the forth clock signal, XCK2, and a reference line for providing a supply voltage, VSS.

In one embodiment, each of the first, second, third and fourth clock signals is characterized with a frequency and a phase. The frequency of the first clock signal and the frequency of the second clock signal are substantially identical and the phase of the first clock signal and the phase of the second clock signal are substantially reversed. The frequency of the third clock signal and the frequency of the fourth clock signal are substantially identical and the phase of the third clock signal and the phase of the fourth clock signal are substantially reversed, respectively. In one embodiment, the frequency of the first clock signal is higher than the frequency of the third clock signal.

In one embodiment, the pull-up control circuit comprises a first transistor T1 having a gate electrically coupled to the fifth input IN5, a source electrically coupled to the gate and a drain.

The pull-up circuit comprises a second transistor T2 having a gate electrically coupled to the drain of the first transistor T1 of the pull-up control circuit, a source electrically coupled to the first input IN1 and a drain electrically coupled to the first output OUT1, and at least one capacitor electrically coupled between the source and the drain of the second transistor T2.

The first pull-down control circuit comprises a fourth transistor T4 having a gate electrically coupled to the second input IN2, a source electrically coupled to the gate and a drain electrically coupled to the second output OUT2, and an eighth transistor T8 having a gate electrically coupled to the gate of the second transistor T2 of the pull-up circuit, a source electrically coupled to the drain of the fourth transistor T4 and a drain electrically coupled to the reference line.

The first pull-down circuit comprises a sixth transistor T6 having a gate electrically coupled to the drain of the fourth transistor T4 of the first pull-down control circuit, a source electrically coupled to the gate of the second transistor T2 of the pull-up circuit and a drain electrically coupled to the drain of the second transistor T2 of the pull-up circuit, and a seventh transistor T7 having a gate electrically coupled to the drain of the fourth transistor T4 of the first pull-down control circuit, a source electrically coupled to the drain of the second transistor T2 of the pull-up circuit and a drain electrically coupled the reference line.

The second pull-down circuit comprises a ninth transistor T9 having a gate electrically coupled to the fourth input IN4, a source electrically coupled to the drain of the second transistor T2 of the pull-up circuit and a drain electrically coupled the reference line, a tenth transistor T10 having a gate electrically coupled to the fourth input IN4, a source electrically coupled to the gate of the second transistor T2 of the pull-up circuit and a drain electrically coupled to the drain of the second transistor T2 of the pull-up circuit, and an eleventh transistor T11 having a gate electrically coupled to the gate of the second transistor T2 of the pull-up circuit, a source electrically coupled to the fourth input IN4 and a drain electrically coupled the reference line.

The third pull-down circuit comprises a twelfth transistor T12 having a gate electrically coupled to the sixth input IN6, a source electrically coupled to the gate of the second transistor T2 of the pull-up circuit and a drain electrically coupled the reference line; and a thirteenth transistor T13 having a gate electrically coupled to the sixth input IN6, a source electrically coupled to the drain of the second transistor T2 of the pull-up circuit and a drain electrically coupled the reference line.

Additionally, each stage $S_n$ further comprises a third transistor T3 having a gate electrically coupled to the seventh input IN7, a source electrically coupled to the reference line and a drain electrically coupled to the drain of the first transistor T1 of the pull-up control circuit, and a fifth transistor T5 having a gate electrically coupled to the eighth input IN8, a source electrically coupled to the reference line and a drain electrically coupled to the drain of the first transistor T1 of the pull-up control circuit.

In another aspect, the present invention relates to a shift register that includes a plurality of stages, $\{S_n\}$, n=1, 2, ..., N, N being a positive integer.

Each stage $S_n$ includes a first input, IN1, for receiving one of a first clock signal, CK1, and a second clock signal, XCK1, a second input, IN2, for receiving a third clock signal, CK2, if the first input IN1 receives the first clock signal CK1, or a fourth clock signal, XCK2, if the first input IN1 receives the second clock signal XCK1, a third input, IN3, for receiving a supply voltage, VSS, a fourth input, IN4, for receiving a fourth input signal, a fifth input, IN5, for receiving a fifth input signal, a sixth input, IN6, for receiving a sixth input signal, a first output, OUT1, for outputting an output signal, $O_n$, and a second output, OUT2, for outputting a pull-down signal, $K_n$.

Each stage $S_n$ also includes a pull-up circuit electrically coupled between the first input IN1 and the first output OUT1, a pull-up control circuit electrically coupled between the fifth inputs IN5 and the pull-up circuit, a first pull-down circuit electrically coupled to the pull-up circuit, a first pull-down control circuit electrically coupled to the second input IN2, the second output OUT2, and the first pull-down circuit, a second pull-down circuit electrically coupled to the fourth input IN4, the first pull-down control circuit and the pull-up circuit, and a third pull-down circuit electrically coupled to the eighth input IN8, the second pull-down circuit and the pull-up circuit. In one embodiment, the fourth input signal is corresponding to one of the pull-down signal $K_{n-1}$ of the (n−1)-th stage $S_{n-1}$ and the pull-down signal $K_{n+1}$ of the (n+1)-th stage $S_{n+1}$, wherein the fifth input signal is corresponding to the output signal $O_{n-1}$ of the (n−1)-th stage $S_{n-1}$, and wherein the sixth input signal is corresponding to the output signal $O_{n+1}$ of the (n+1)-th stage $S_{n+1}$.

In one embodiment, the pull-up control circuit comprises a first transistor T1 having a gate electrically coupled to the fifth input IN5, a source electrically coupled to the gate and a drain.

The pull-up circuit comprises a second transistor T2 having a gate electrically coupled to the drain of the first transistor T1 of the pull-up control circuit, a source electrically coupled to the first input IN1 and a drain electrically coupled to the first output OUT1, and at least one capacitor electrically coupled between the source and the drain of the second transistor T2.

The first pull-down control circuit comprises a fourth transistor T4 having a gate electrically coupled to the second input IN2, a source electrically coupled to the gate and a drain electrically coupled to the second output OUT2, and an eighth transistor T8 having a gate electrically coupled to the gate of the second transistor T2 of the pull-up circuit, a source electrically coupled to the drain of the fourth transistor T4 and a drain configured to receive the supply voltage VSS.

The first pull-down circuit comprises a sixth transistor T6 having a gate electrically coupled to the drain of the fourth transistor T4 of the first pull-down control circuit, a source electrically coupled to the gate of the second transistor T2 of the pull-up circuit and a drain electrically coupled to the drain of the second transistor T2 of the pull-up circuit, and a seventh transistor T7 having a gate electrically coupled to the drain of the fourth transistor T4 of the first pull-down control circuit, a source electrically coupled to the drain of the second transistor T2 of the pull-up circuit and a drain configured to receive the supply voltage VSS.

The second pull-down circuit comprises a ninth transistor T9 having a gate electrically coupled to the fourth input IN4, a source electrically coupled to the drain of the second transistor T2 of the pull-up circuit and a drain configured to receive the supply voltage VSS, a tenth transistor T10 having a gate electrically coupled to the fourth input IN4, a source electrically coupled to the gate of the second transistor T2 of the pull-up circuit and a drain electrically coupled to the drain of the second transistor T2 of the pull-up circuit, and an eleventh transistor T11 having a gate electrically coupled to the gate of the second transistor T2 of the pull-up circuit, a source electrically coupled to the fourth input IN4 and a drain configured to receive the supply voltage VSS.

The third pull-down circuit comprises a twelfth transistor T12 having a gate electrically coupled to the sixth input IN6, a source electrically coupled to the gate of the second transistor T2 of the pull-up circuit and a drain configured to receive the supply voltage VSS, and a thirteenth transistor T13 having a gate electrically coupled to the sixth input IN6, a source electrically coupled to the drain of the second transistor T2 of the pull-up circuit and a drain configured to receive the supply voltage VSS Also, each stage $S_n$ comprises a seventh input, IN7, for receiving a seventh input signal, an eighth input, IN8, for receiving a eighth input signal, a third transistor T3 having a gate electrically coupled to the seventh input IN7, a source configured to receive the supply voltage VSS and a drain electrically coupled to the drain of the first transistor T1 of the pull-up control circuit, and a fifth transistor T5 having a gate electrically coupled to the eighth input IN8, a source configured to receive the supply voltage VSS and a drain electrically coupled to the drain of the first transistor T1 of the pull-up control circuit. The seventh input signal is corresponding to the output signal $O_{n+2}$ of the (n+2)-th stage $S_{n+2}$. The eighth input signal is corresponding to the output signal $O_{n-2}$ of the (n−2)-th stage $S_{n-2}$.

In yet another aspect, the present invention relates to a shift register comprising a plurality of stages, $\{S_n\}$, n=1, 2, ..., N, N being a positive integer. In one embodiment, each stage $S_n$ comprises a pull-up circuit having an input for receiving one of a first clock signal, CK1, and a second clock signal, XCK1, an output for responsively outputting an output signal, $O_n$, and an input node $Q_n$, a pull-up control circuit electrically coupled to the input node $Q_n$ of the pull-up circuit and configured such that when receiving a first input signal, the pull-up control circuit responsively generates a signal that is provided to the input node $Q_n$ of the pull-up circuit to turn on the pull-up circuit, a pull-down circuit electrically coupled to the input node $Q_n$ of the pull-up circuit and configured to provide a first voltage to one of the input node $Q_n$ and the output of the pull-up circuit, a pull-down control circuit configured to receive one of a third clock signal, CK2, and a fourth clock signal, XCK2, and responsively generate the first voltage to turn on the pull-down circuit of the stage $S_n$ and the pull-down circuit of one of the stage $S_{n-1}$ and the stage $S_{n+1}$, and a key pull-down circuit configured to receive a second input signal. The first input signal is corresponding to the output signal $O_{n-1}$ of the stage $S_{n-1}$, and the second input signal is corresponding to the output signal $O_{n+1}$ of the stage $S_{n+1}$.

In one embodiment, the pull-up circuit 1010 comprises a first transistor T1 having a gate electrically coupled to the input node $Q_n$, a source electrically coupled to the input for receiving one of the first clock signal CK1 and the second clock signal XCK1 and a drain electrically coupled to the output for outputting the output signal $O_n$.

The pull-up control circuit 1020 comprises a third transistor T3 having a gate, a source electrically coupled to the output of the stage $S_{n-1}$ for receiving the output signal $O_{n-1}$ therefrom and a drain electrically coupled to the input node $Q_n$ of the pull-up circuit 1010, and a fourth transistor T4 having gate electrically coupled to the input node $Q_{n-1}$ of the pull-up circuit of the stage $S_{n-1}$, a source configured to receive the second clock signal XCK1 if the input of the pull-up circuit receives the first clock signal CK1 or the first clock signal CK1 if the input of the pull-up circuit receives the second clock signal XCK1 and a drain electrically coupled to the gate of the third transistor T3.

The pull-down control circuit comprises a seventh transistor T7 having a gate configured to receive a third clock signal CK2, a source electrically coupled to the gate and a drain electrically coupled to a node K, an eighth transistor T8 having a gate electrically coupled to the input node $Q_{n-1}$ of the pull-up circuit of the stage $S_{n-1}$, a source electrically coupled to the node K and a drain configured to receive a supply voltage VSS, and a ninth transistor T9 having a gate electrically coupled to the input node $Q_n$ of the pull-up circuit, a source electrically coupled to the node K and a drain configured to receive the supply voltage VSS.

The pull-down circuit comprises a thirteenth transistor T13 having a gate electrically coupled to the node K of the pull-down control circuit, a source electrically coupled to the input node $Q_n$ and a drain configured to receive the supply voltage VSS; and a fourteenth transistor T14 having a gate electrically coupled to the node K of the pull-down control circuit, a source electrically coupled to the output of the pull-up circuit and a drain configured to receive the supply voltage VSS.

The key pull-down circuit comprises a twenty-first transistor T21 having a gate electrically coupled to the output of the stage $S_{n+1}$ for receiving the output signal $O_{n+1}$ therefrom, a source electrically coupled to the input node $Q_n$ of the pull-up circuit and a drain configured to receive the supply voltage VSS, and a twenty-second transistor T22 having a gate electrically coupled to the output of the stage $S_{n+1}$ for receiving the output signal $O_{n+1}$ therefrom, a source electrically coupled to the output of the pull-up circuit and a drain configured to receive the supply voltage VSS.

Additionally, each stage $S_n$ also comprises a twenty-fifth transistor T25 having a gate configured to receive the output signal $O_{n-2}$ of the (n−2)-th stage $S_{n-2}$, a source configured to receive the supply voltage VSS and a drain electrically coupled to the input node $Q_n$, of the pull-up circuit; and a twenty-sixth transistor T26 having a gate configured to receive the output signal $O_{n+2}$ of the (n+2)-th stage $S_{n+2}$, a source configured to receive the supply voltage VSS and a drain electrically coupled to the input node $Q_n$ of the pull-up circuit.

In a further aspect, the present invention relates to a shift register. In one embodiment, the shift register has a plurality of stages, $\{S_n\}$, n=1, 2, ..., N, N being a positive integer. Each stage $S_n$ includes a pull-up circuit having an input for receiving a corresponding clock signal Cn, an output for responsively outputting an output signal, $O_n$, and an input node, $Q_n$, between the input and the output, a pull-up control circuit electrically coupled to the input node $Q_n$ of the pull-up circuit 810 and configured such that when receiving a first input signal, the pull-up control circuit responsively generates a signal that is identical to the first input signal and is provided to the input node $Q_n$ of the pull-up circuit to turn on the pull-up circuit, a first pull-down circuit electrically coupled to the input node $Q_n$ and the output of the pull-up circuit and configured to receive a pull-down signal $K_n$, a second pull-down circuit electrically coupled to the input node $Q_n$ and the output of the pull-up circuit, and configured to receive a second input signal, a third pull-down circuit electrically coupled to the input node $Q_n$ and the output of the pull-up circuit and configured to receive a third input signal, and a first pull-down control circuit configured to receive a fourth input signal and responsively generate the pull-down signal $K_n$ that is provided to the first pull-down circuit of the stage $S_n$ and the second pull-down circuit of one of the stage $S_{n-1}$ and the stage $S_{n+1}$, respectively.

In one embodiment, each of the clock signals {Cn}, n=1, 2, 3, ..., N, is characterized with a frequency and a phase, wherein the frequencies of the clock signals {Cn} are substantially identical, and the phases of the clock signals {Cn} are sequentially shifted, respectively.

The second input signal is corresponding to the pull-down signal $K_{n-1}$ of the stage $S_{n-1}$ or the pull-down signal $K_{n+1}$ of the stage $S_{n+1}$, and the third input signal is corresponding to the output signal $O_{n+2}$ of the stage $S_{n+2}$, In one embodiment, the first input signal is corresponding to the output signal $O_{n-1}$ of the stage $S_{n-1}$ for n=2, 3, 4, ..., N, or a start signal for n=1. In another embodiment, the first input signal is corresponding to the output signal $O_{n-2}$ of the stage $S_{n-2}$ for n=3, 4, 5, ..., N, or a start signal for n=1 and 2. In an alternative embodiment, the first input signal is corresponding to a start signal.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
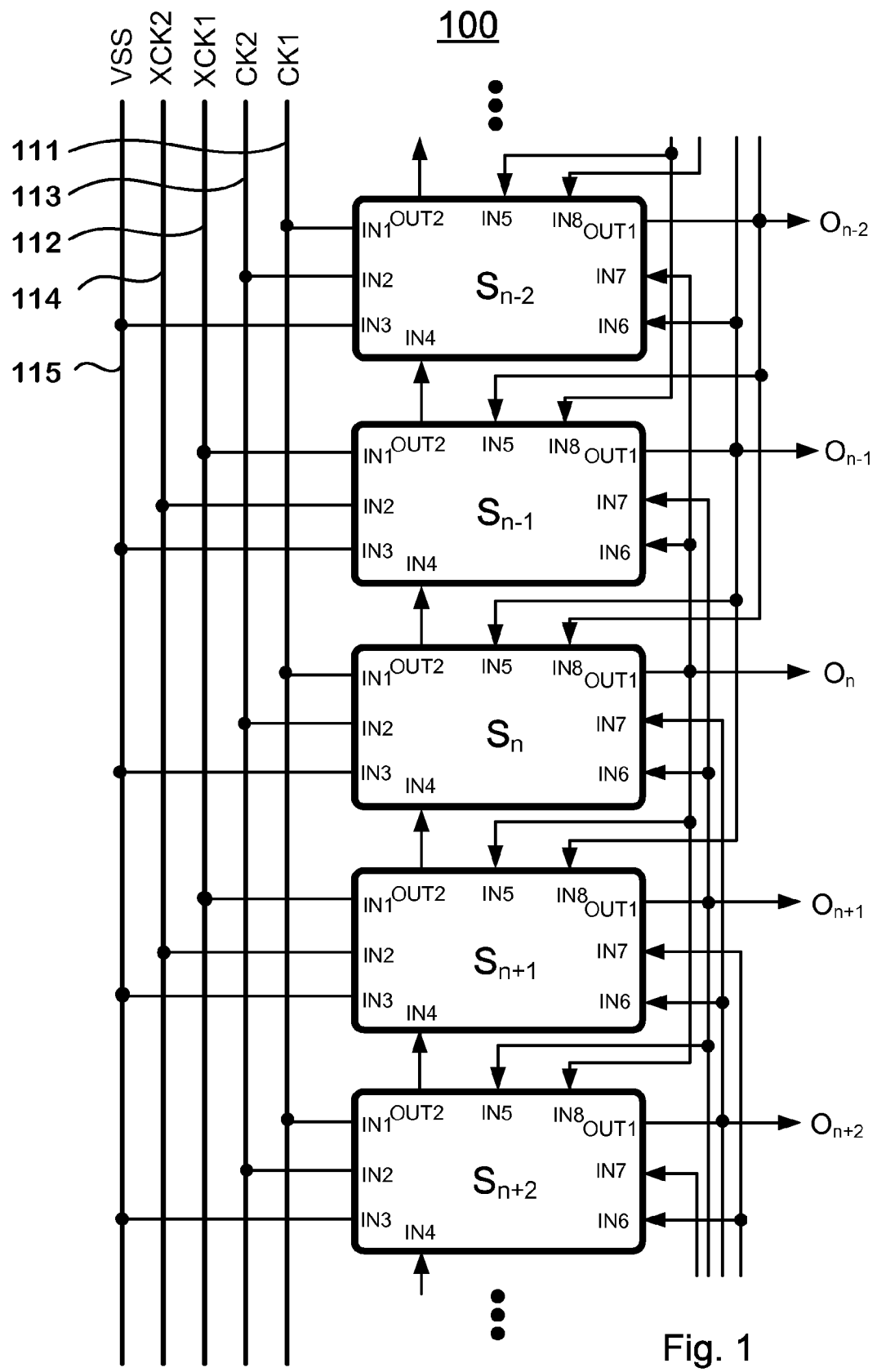
FIG. 1 shows a block diagram of a shift register according to one embodiments of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The description will be made as to the embodiments of the present invention in conjunction with the accompanying drawings in FIGS. 1-20. In accordance with the purposes of this invention, as embodied and broadly described herein, this invention, in one aspect, relates to a shift register with embedded bidirectional scanning function.

Referring in general to FIG. 1, a shift register 100 is shown according to one embodiment of the present invention. The shift register includes a first clock signal line 111 for providing the first clock signal, CK1, a second clock signal line 112 for providing the second clock signal, XCK2, a third clock signal line 113 for providing the third clock signal, CK1, a fourth clock signal line 114 for providing the forth clock signal, XCK2, and a reference line 115 for providing a supply voltage, VSS.

In one embodiment, each of the first, second, third and fourth clock signals, CK1, XCK1, CK2 and XCK2 is characterized with a frequency and a phase. The frequency of the first clock signal CK1 and the frequency of the second clock signal XCK1 are substantially identical and the phase of the first clock signal CK1 and the phase of the second clock signal XCK1 are substantially reversed. The frequency of the third clock signal CK2 and the frequency of the fourth clock signal XCK2 are substantially identical and the phase of the third clock signal CK2 and the phase of the fourth clock signal XCK2 are substantially reversed, respectively. In one embodiment, the frequency of the first clock signal CK1 is higher than the frequency of the third clock signal CK2.

The shift register 100 includes a plurality of stages, {$S_n$}, n=1, 2, ..., N, N being a positive integer.

Each stage $S_n$ has a first input, IN1, for receiving one of a first clock signal, CK1, and a second clock signal, XCK1, a second input, IN2, for receiving a third clock signal, CK2, if the first input IN1 receives the first clock signal CK1, or a fourth clock signal, XCK2, if the first input IN1 receives the second clock signal XCK1, a third input, IN3, for receiving a supply voltage, VSS, a fourth input, IN4, a fifth input, IN5, a sixth input, IN6, a seventh input, IN7, and an eighth input, IN8.

Each stage $S_n$ also has a first output, OUT1, for outputting an output signal, $O_n$, and a second output, OUT2, for outputting a pull-down signal, $K_n$.

The plurality of stages $\{S_n\}$ is electrically coupled in serial. As shown in FIG. 1, the fourth input IN4 of the n-th stage $S_n$ is electrically coupled to the second output OUT2 of the (n+1)-th stage $S_{n+1}$, for receiving a corresponding pull-down output signal $K_{n+1}$ therefrom. The fifth input IN5 of the n-th stage $S_n$ is electrically coupled to the first output OUT1 of the (n−1)-th stage $S_{n-1}$, for receiving a corresponding output signal $O_{n-1}$ therefrom. The sixth input IN6 of the n-th stage $S_n$ is electrically coupled to the first output OUT1 of the (n+1)-th stage $S_{n+1}$, for receiving a corresponding output signal $O_{n+1}$ therefrom. The seventh input IN7 of the n-th stage $S_n$ is electrically coupled to the first output OUT1 of the (n+2)-th stage $S_{n+2}$, for receiving a corresponding output signal $O_{n+2}$ therefrom. The eighth input IN8 of the n-th stage $S_n$ is electrically coupled to the first output OUT1 of the (n−2)-th stage $S_{n-2}$, for receiving a corresponding output signal $O_{n-2}$ therefrom.

Figure 2:
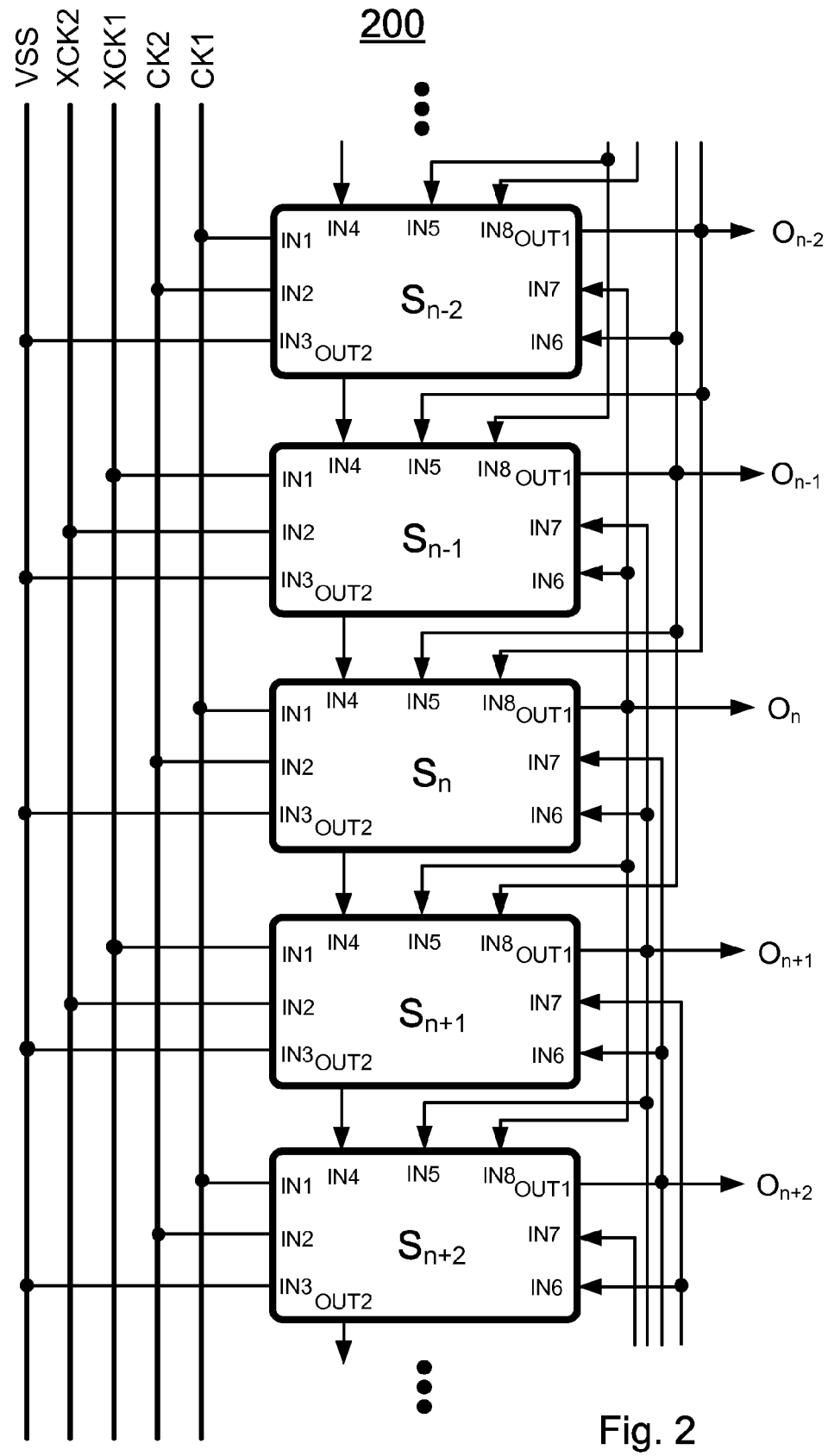
FIG. 2 shows a block diagram of a shift register according to another embodiments of the present invention.

FIG. 2 shows a shift register 200 according to another embodiment of the present invention. The shift register 200 has the same design as the shift register 100, except that the fourth input IN4 of the n-th stage $S_n$ is electrically coupled to the second output OUT2 of the (n−1)-th stage $S_{n-1}$, for receiving a corresponding pull-down output signal $K_{n-1}$ therefrom.

Figure 3:
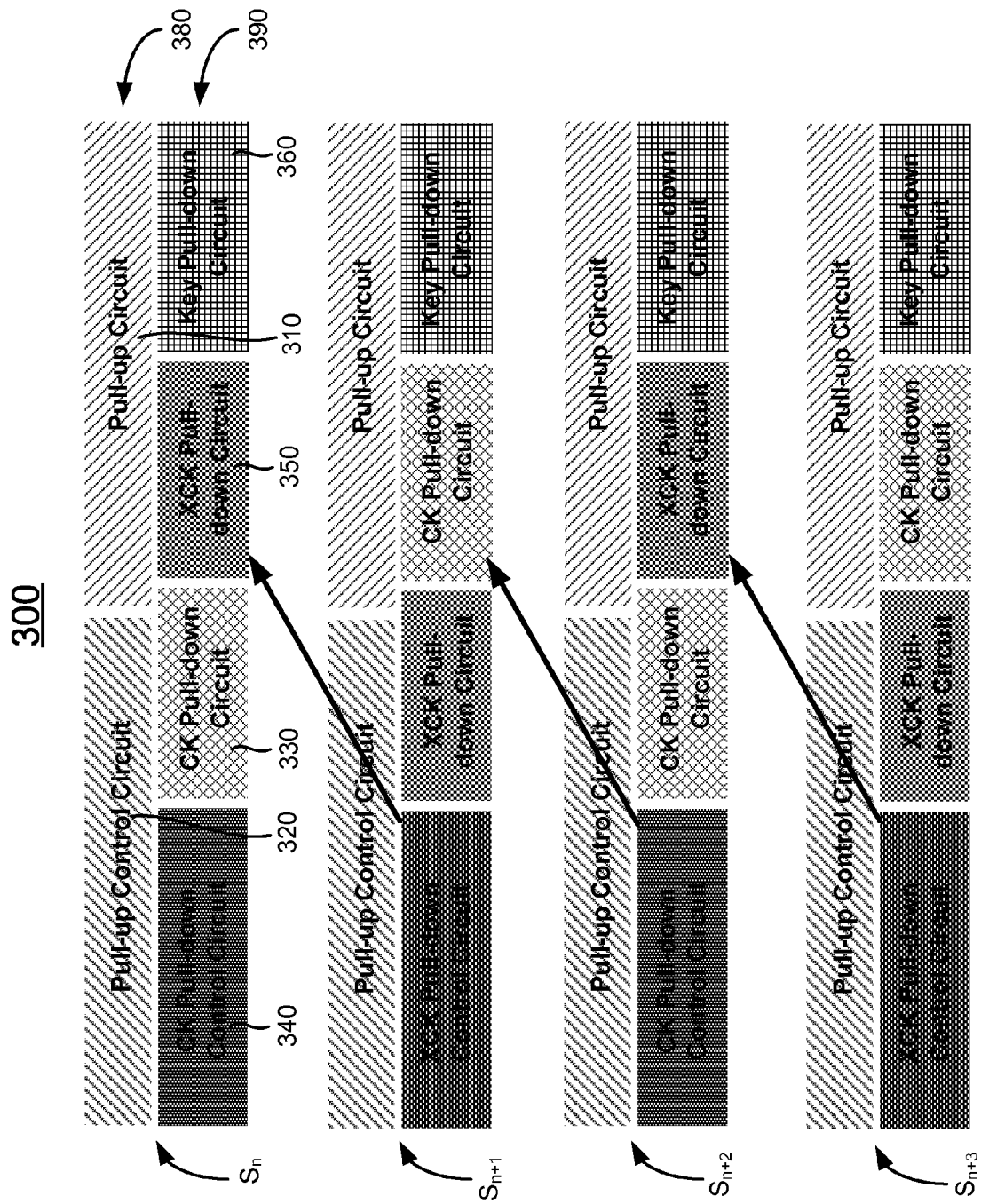
FIG. 3 shows a GOA architecture of a shift register according to one embodiment of the present invention.

FIG. 3 shows schematically a GOA architecture of a shift register 300 according to one embodiment of the present invention. The shift register 300 has multiple stages $\{S_n\}$ that are deposited/formed on a glass substrate (not shown). FIG. 3 shows only four stages $S_n$, $S_{n+1}$, $S_{n+2}$, and $S_{n+3}$. Each stage has a pull-up control circuit 320 and a pull-up circuit 310 formed adjacent to the pull-up control circuit 320 on the glass substrate along a first row 380. Each stage also has a first pull-down control circuit 340, a first pull-down circuit 330, a second pull-down circuit 350 and a key pull-down circuit 360 formed on the substrate, in turn, along a second row 390 that is adjacent to the first row 380.

Depending upon which the first, second, third and fourth clock signals, CK1, XCK1, CK2 and XCK2 are input into a stage, the first pull-down control circuit 340 can be a CK pull-down control circuit or an XCK pull-down control circuit; the first pull-down circuit 330 can be a CK pull-down circuit or an XCK pull-down circuit; and the second pull-down circuit 350 can be an XCK pull-down control circuit or a CK pull-down circuit. For example, if the first and third clock signals CK1 and CK2 are respectively input into the first and second inputs IN1 and IN2 of a stage, for example, stage $S_n$, the first pull-down control circuit 340, the first pull-down circuit 330 and the second pull-down circuit 350 are corresponding to a CK pull-down control circuit, a CK pull-down circuit and an XCK pull-down control circuit, respectively. If the second and fourth clock signals XCK1 and XCK2 are respectively input into the first and second inputs IN1 and IN2 of a stage, for example, stage $S_{n+1}$, the first pull-down control circuit 340, the first pull-down circuit 330 and the second pull-down circuit 350 are corresponding to an XCK pull-down control circuit, an XCK pull-down circuit and a CK pull-down control circuit, respectively.

For such a design, a single pull-down control circuit 340 is utilized to control the first pull-up circuit of the stage $S_n$, and a pull-up circuit of the stage $S_{n-1}$.

Figure 4:
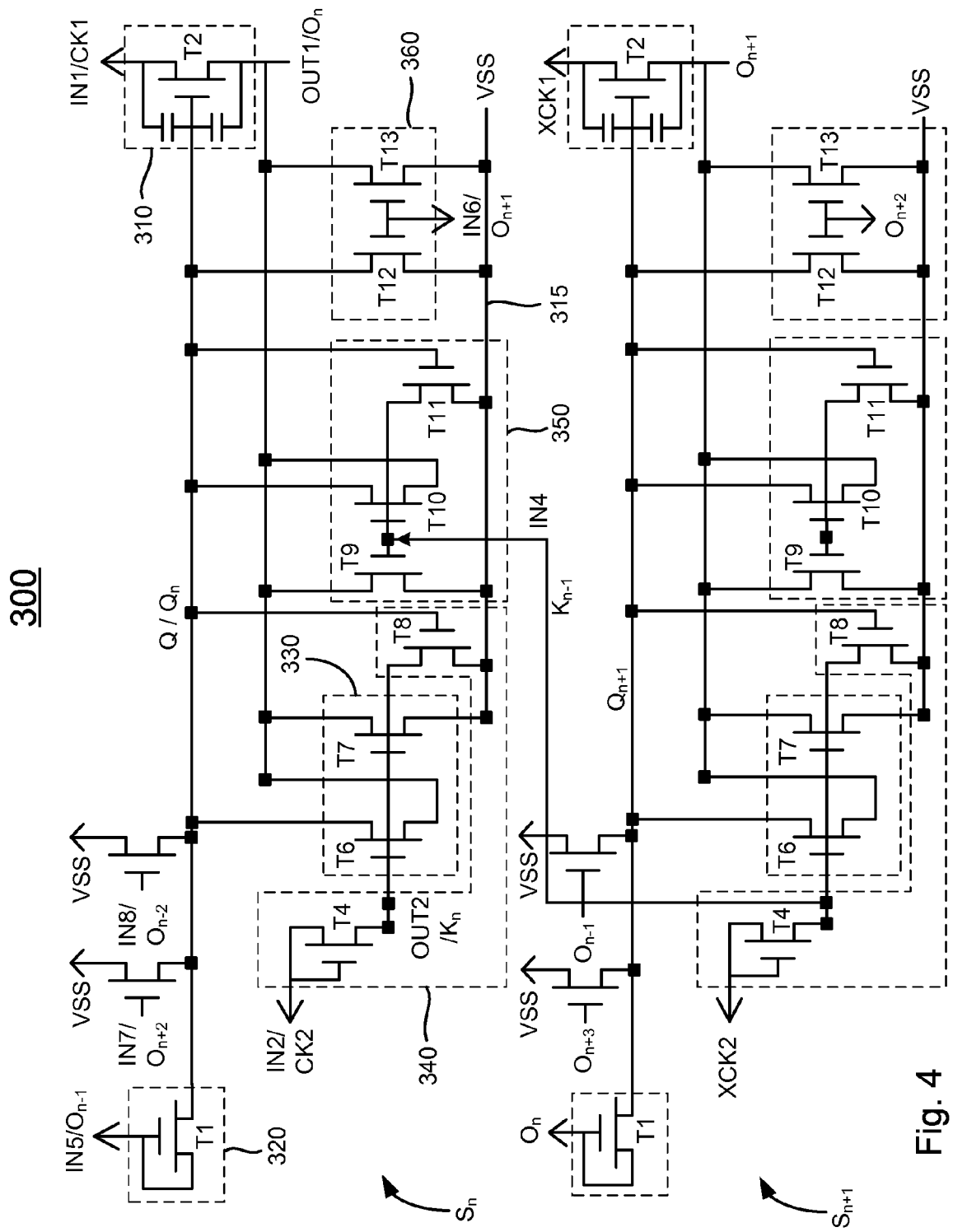
FIG. 4 shows a circuit diagram of two neighboring stages of a shift register according to one embodiment of the present invention.

Referring to FIG. 4, a circuit diagram of two neighboring stages $S_n$ and $S_{n+1}$ of the shift register 300 is shown. Each stage $S_n$ includes a first input IN1 for receiving one of the first clock signal CK1 and the second clock signal XCK, a second input IN2 for receiving the third clock signal CK2 if the first input IN1 receives the first clock signal CK1, or the fourth clock signal XCK2 if the first input IN1 receives the second clock signal XCK1, a third input IN3 for receiving the supply voltage VSS a fourth input IN4 for receiving a fourth input signal, a fifth input IN5 for receiving a fifth input signal, a sixth input IN6 for receiving a sixth input signal, a first output OUT1 for outputting an output signal $O_n$, and a second output OUT2 for outputting a pull-down signal $K_n$.

Each stage $S_n$ includes a pull-up circuit 310, a pull-up control circuit 320, a first pull-down circuit 330, a first pull-down control circuit 340, a second pull-down circuit 350 a third pull-down circuit 360. The pull-up circuit 310 is electrically coupled between the first input IN1 and the first output OUT1. The pull-up control circuit 320 is electrically coupled between the fifth inputs IN5 and the pull-up circuit 310. The first pull-down circuit 330 is electrically coupled to the pull-up circuit 310. The first pull-down control circuit 340 is electrically coupled to the second input IN2, the second output OUT2, and the first pull-down circuit 330. The second pull-down circuit 350 is electrically coupled to the fourth input IN4, the first pull-down control circuit 340 and the pull-up circuit 310. The third pull-down circuit 360 electrically coupled to the eighth input IN8, the second pull-down circuit 350 and the pull-up circuit 310. As shown in FIG. 3, the fourth input signal is corresponding to the pull-down signal $K_{n+1}$ of the (n+1)-th stage $S_{n+1}$. The fifth input signal is corresponding to the output signal $O_{n-1}$ of the (n−1)-th stage $S_{n-1}$. The sixth input signal is corresponding to the output signal $O_{n+1}$ of the (n+1)-th stage $S_{n+1}$.

Specifically, the pull-up control circuit 320 has a first transistor T1 having a gate electrically coupled to the fifth input IN5 for receiving the output signal $O_{n-1}$ of the stage $S_{n-1}$, a source electrically coupled to the gate and a drain electrically coupled to a node Q.

The pull-up circuit 310 has a second transistor T2 having a gate electrically coupled to the node Q, a source electrically coupled to the first input IN1 for receiving the first clock signal CK1 or the second clock signal XCK1, and a drain electrically coupled to the first output OUT1 for outputting an stage output signal $O_n$ in response to the received first clock signal CK1 or second clock signal XCK1 in the source. Additionally, the pull-up circuit 310 also has two serial-connected capacitors are electrically coupled between the source and the drain of the second transistor T2.

The first pull-down control circuit 340 has a fourth transistor T4 having a gate electrically coupled to the second input IN2 for receiving the third clock signal CK2 if the source of the second transistor T2 receives the first clock signal CK1 or the fourth clock signal XCK2 if the source of the second transistor T2 receives the second clock signal XCK1, a source electrically coupled to the gate and a drain electrically coupled to the second output OUT2 for outputting the pull-down signal $K_n$, which is provided to the second pull-down circuit 350 of the stage $S_{n+1}$ or $S_{n-1}$. The first pull-down control circuit 340 also has an eighth transistor T8 having a gate electrically coupled to the node Q that is eclectically connected to the gate of the second transistor T2 of the pull-up circuit 310, a source electrically coupled to the drain of the fourth transistor T4 and a drain configured to receive the supply voltage VSS.

The first pull-down circuit 330 includes a sixth transistor T6 and a seventh transistor T7. The sixth transistor T6 has a gate electrically coupled to the drain of the fourth transistor T4 of the first pull-down control circuit 340, a source electrically coupled to the node Q or the gate of the second transistor T2 of the pull-up circuit 310 and a drain electrically coupled to the drain of the second transistor T2 of the pull-up circuit 310 which is electrically connected to the first output OUT1. The seventh transistor T7 having a gate electrically coupled to the drain of the fourth transistor T4 of the first pull-down control circuit 340, a source electrically coupled to the drain of the second transistor T2 of the pull-up circuit 310 and a drain configured to receive the supply voltage VSS.

The second pull-down circuit 350 has a ninth transistor T9, a tenth transistor T10 and an eleventh transistor T11. The ninth transistor T9 has a gate electrically coupled to the fourth input IN4 for receiving the pull-down signal $K_{n+1}$ of the stage $S_{n+1}$ or the pull-down signal $K_{n+1}$ of the stage $S_{n-1}$, a source electrically coupled to the drain of the second transistor T2 of the pull-up circuit 310 and a drain configured to receive the supply voltage VSS. The tenth transistor T10 has a gate electrically coupled to the fourth input IN4 for receiving the pull-down signal $K_{n+1}$ of the stage $S_{n+1}$ or the pull-down signal $K_{n+1}$ of the stage $S_{n-1}$, a source electrically coupled to the node Q or the gate of the second transistor T2 of the pull-up circuit 310 and a drain electrically coupled to the drain of the second transistor T2 of the pull-up circuit 310. The eleventh transistor T11 has a gate electrically coupled to the gate of the second transistor T2 of the pull-up circuit 310, a source electrically coupled to the fourth input IN4 and a drain configured to receive the supply voltage VSS.

The third pull-down circuit 360 has a twelfth transistor T12 and a thirteenth transistor T13. The twelfth transistor T12 has a gate electrically coupled to the sixth input IN6 for receiving the output signal $O_{n+1}$ of the stage $S_{n+1}$, a source electrically coupled to the node Q or the gate of the second transistor T2 of the pull-up circuit 310 and a drain configured to receive the supply voltage VSS. The thirteenth transistor T13 has a gate electrically coupled to the sixth input IN6 or receiving the output signal $O_{n+1}$ of the stage $S_{n+1}$, a source electrically coupled to the drain of the second transistor T2 of the pull-up circuit 310 and a drain configured to receive the supply voltage VSS.

Also, each stage $S_n$ include a seventh input, IN7 for receiving a seventh input signal, an eighth input, IN8, for receiving a eighth input signal, a third transistor T3 and a fifth transistor T5. The seventh input signal is corresponding to the output signal $O_{n+2}$ of the (n+2)-th stage $S_{n+2}$. The eighth input signal is corresponding to the output signal $O_{n-2}$ of the (n−2)-th stage $S_{n-2}$. The third transistor T3 has a gate electrically coupled to the seventh input IN7, a source configured to receive the supply voltage VSS and a drain electrically coupled to the drain of the first transistor T1 of the pull-up control circuit 320. The fifth transistor T5 has a gate electrically coupled to the eighth input IN8, a source configured to receive the supply voltage VSS and a drain electrically coupled to the drain of the first transistor T1 of the pull-up control circuit 320.

When the first clock signal CK1 and the second clock signal XCK1 are respectively input into the first input IN1 and the second input IN2, the first pull-down control circuit 340, the first pull-down circuit 330, the second pull-down circuit 350, and the third pull-down circuit 360 are corresponding to the CK pull-down control circuit, the CK pull-down circuit, XCK pull-down circuit and Key pull-down circuit shown in FIG. 3, respectively. Otherwise, when the third clock signal CK2 and the fourth clock signal XCK2 are respectively input into the first input IN1 and the second input IN2, the first pull-down control circuit 340, the first pull-down circuit 330, the second pull-down circuit 350, and the third pull-down circuit 360 are corresponding to the XCK pull-down control circuit, the XCK pull-down circuit, CK pull-down circuit and Key pull-down circuit shown in FIG. 3, respectively.

Figure 5:
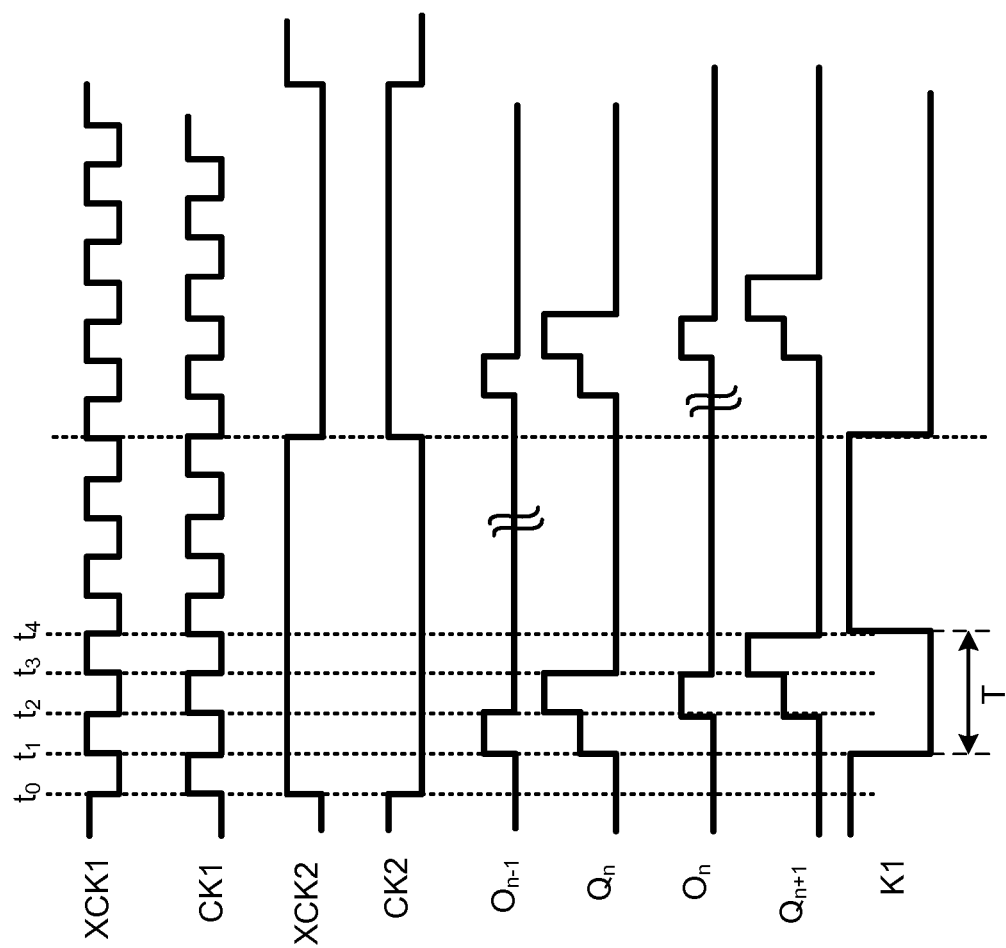
FIG. 5 shows a timing chart of input and output signals of the shift register as shown in FIG. 4.

FIG. 5 shows a timing chart of input and output signals for the shift register as shown in FIG. 4. The first, second, third and fourth clock signals, CK1, XCK1, CK2 and XCK2 are the input signals. Each of the first, second, third and fourth clock signals, CK1, XCK1, CK2 and XCK2 is characterized with a frequency and a phase. The frequency of the first clock signal CK1 and the frequency of the second clock signal XCK1 are substantially identical and the phase of the first clock signal CK1 and the phase of the second clock signal XCK1 are substantially reversed. The frequency of the third clock signal CK2 and the frequency of the fourth clock signal XCK2 are substantially identical and the phase of the third clock signal CK2 and the phase of the fourth clock signal XCK2 are substantially reversed, respectively. In the exemplary embodiment, the frequency of the first clock signal CK1 is higher than the frequency of the third clock signal CK2.

Signals $O_n$ and $O_{n-1}$ are respectively the output signals from the stages $S_n$ and $S_{n-1}$, in response to the input signals received in the stages $S_n$ and $S_{n-1}$. Signal K1 is the pull-down signal output from the second output OUT2 of the stage $S_{n-1}$ or $S_{n+1}$. Signals $Q_n$ and $Q_{n+1}$ are the voltage at the node Q of the stages $S_n$ and $S_{n+1}$, respectively.

Figure 6:
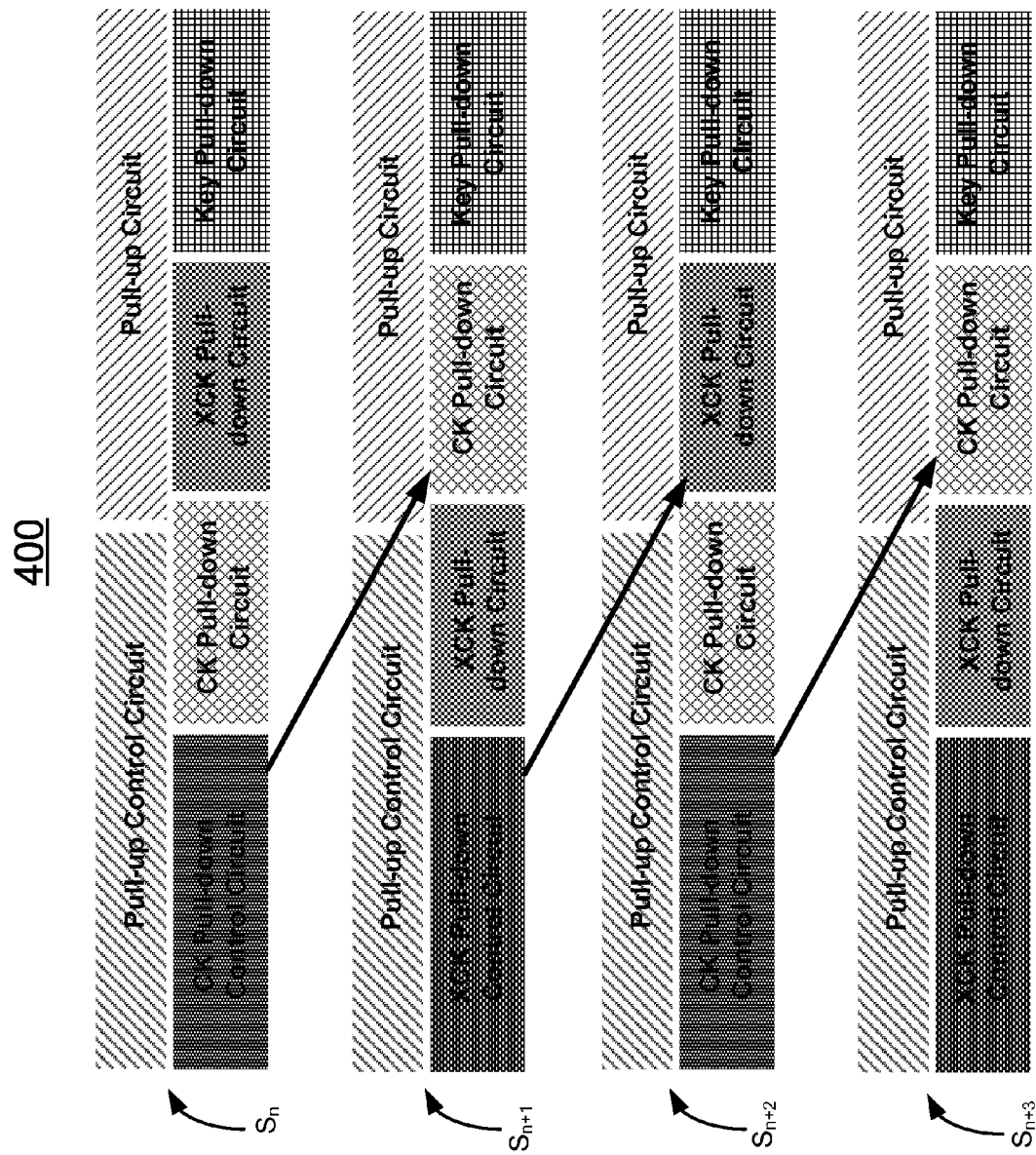
FIG. 6 shows a GOA architecture of a shift register according to another embodiment of the present invention.

FIG. 6 shows schematically a GOA architecture of a shift register 400 according to another embodiment of the present invention. The GOA architecture of the shift register 400 is same as that of the shift register 300 shown in FIG. 3, except that a single CK/XCK pull-down control circuit is used to control the CK/XCK pull-up circuit of the stage $S_n$, and a XCK/CK pull-up circuit of the stage $S_{n+1}$.

Figure 7:
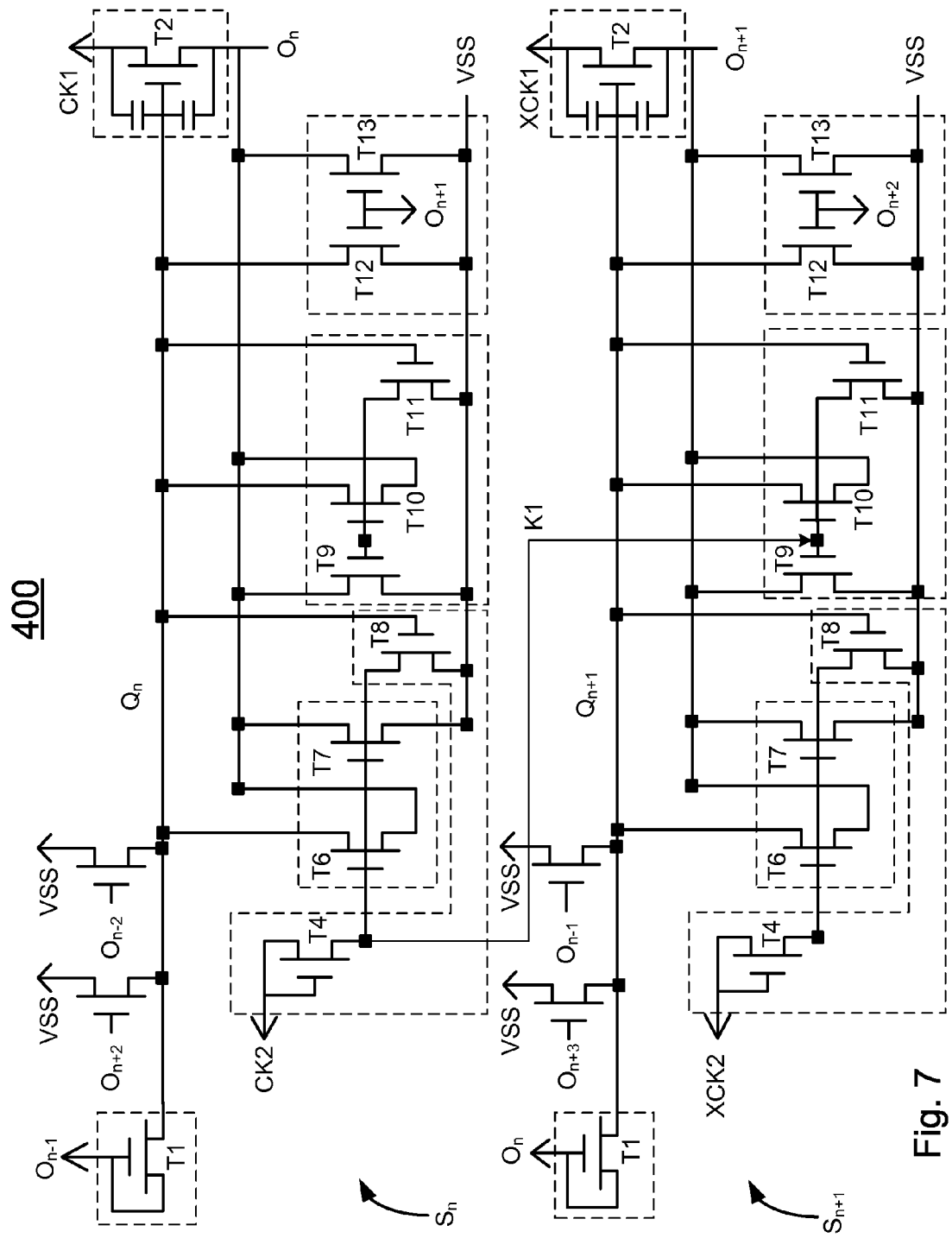
FIG. 7 shows a circuit diagram of two neighboring stages of a shift register according to another embodiment of the present invention.

FIG. 7 shows a circuit diagram of two neighboring stages $S_n$ and $S_{n+1}$ of the shift register 400. The circuit diagram is same as that of the shift register 300 shown in FIG. 4, except that the fourth input signal is corresponding to the pull-down signal $K_{n-1}$ of the (n−1)-th stage $S_{n-1}$.

Figure 8:
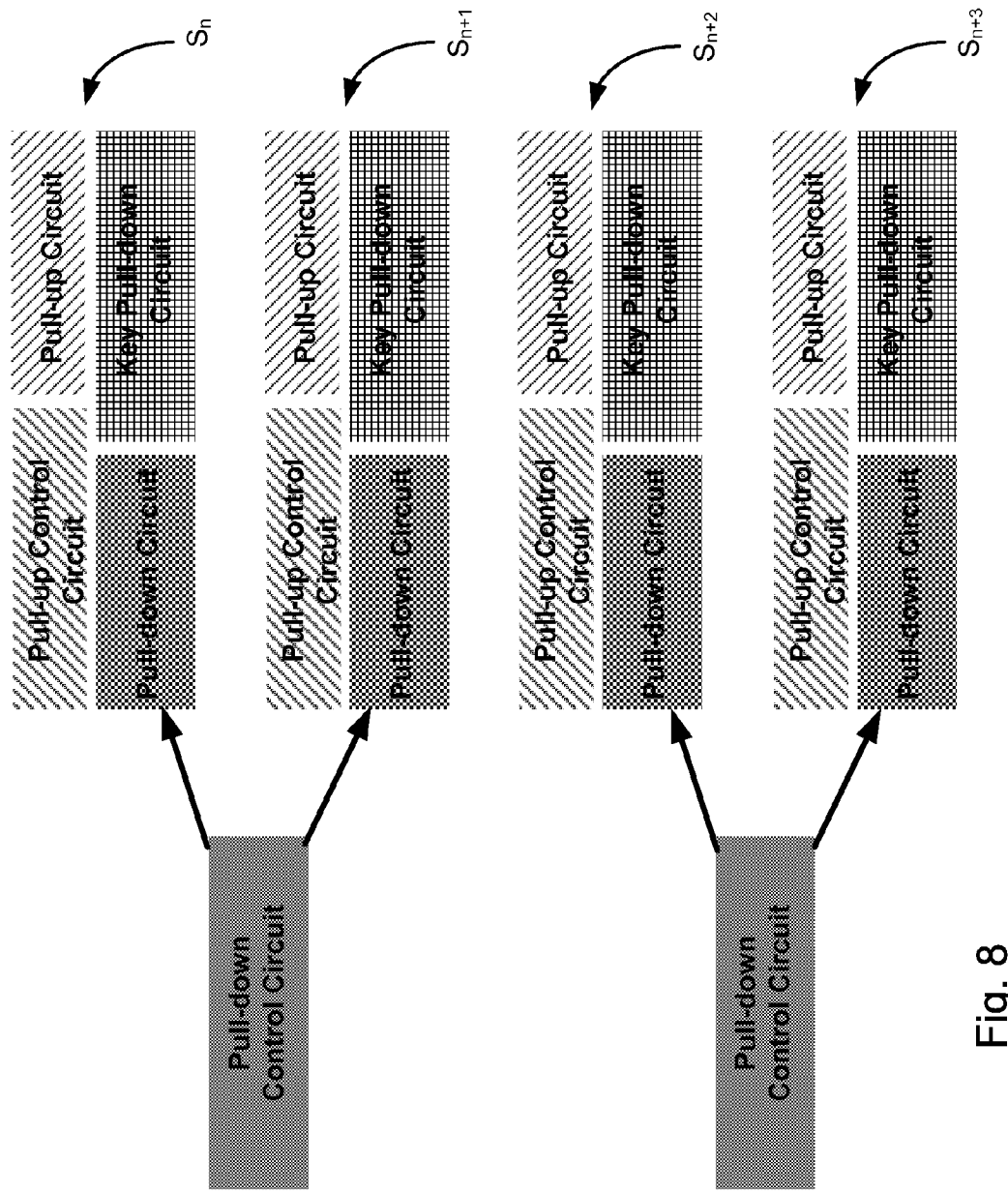
FIG. 8 shows a GOA architecture of a shift register according to one embodiment of the present invention.

Referring to FIG. 8, a GOA architecture of a shift register 500 is shown according to yet another embodiment of the present invention.

Figure 9:
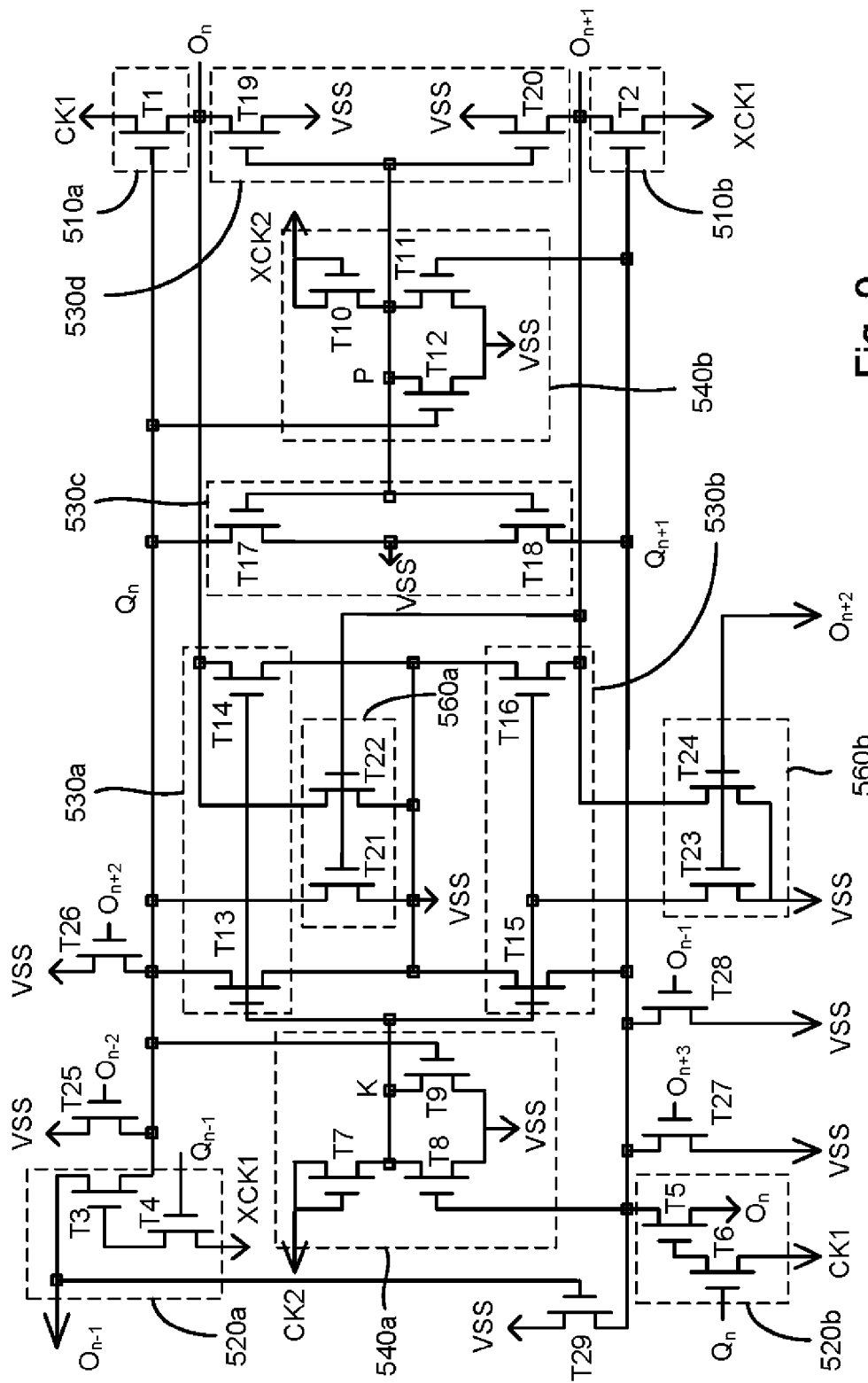
FIG. 9 shows a circuit diagram of two neighboring stages of a shift register according to one embodiment of the present invention.

A circuit diagram of a pair of two neighboring stages $S_n$ and $S_{n+1}$ of the shift register 500 is shown in FIG. 9. The pair of stages $S_n$ and $S_{n+1}$ includes pull-up circuits 510a and 510b, pull-up control circuits 420a and 520b, pull-down control circuits 540a and 540b, pull-down circuits 530a, 530b, 530c and 530d, and key pull-down circuits 560a and 560b.

Specifically, the pull-up circuit 510a has a first transistor T1 having a gate electrically coupled to the input node $Q_n$, a source electrically coupled to the input for receiving the first clock signal CK1 and a drain electrically coupled to the output for outputting the output signal $O_n$. The pull-up circuit 510b has a first transistor T2 having a gate electrically coupled to the input node $Q_{n+1}$, a source electrically coupled to the input for receiving the second clock signal XCK1 and a drain electrically coupled to the output for outputting the output signal $O_{n+1}$.

The pull-up control circuit 520a includes a third transistor T3 and a fourth transistor T4. The third transistor T3 has a gate, a source electrically coupled to the output of the stage $S_{n-1}$ for receiving the output signal $O_{n-1}$ therefrom and a drain electrically coupled to the input node $Q_n$ or the gate of the pull-up circuit 510a. The fourth transistor T4 has a gate electrically coupled to the input node $Q_{n-1}$ of the stage $S_{n-1}$, a source configured to receive the second clock signal XCK1 and a drain electrically coupled to the gate of the third transistor T3. The pull-up control circuit 520b includes a fifth transistor T5 and a sixth transistor T6. The fifth transistor T5 has a gate, a source electrically coupled to the output of the stage $S_n$ for receiving the output signal $O_n$ therefrom and a drain electrically coupled to the input node $Q_{n+1}$ or the gate of the pull-up circuit 510b. The sixth transistor T6 has a gate electrically coupled to the input node $Q_n$ of the stage $S_n$, a source configured to receive the first clock signal CK1 and a drain electrically coupled to the gate of the fifth transistor T5.

The pull-down control circuit 540a comprises a seventh transistor T7, an eighth transistor T8 and a ninth transistor T9. The seventh transistor T7 has a gate configured to receive the third clock signal CK2, a source electrically coupled to the gate and a drain electrically coupled to a node K. The eighth transistor T8 has a gate electrically coupled to the input node $Q_{n+1}$ or the gate of the second transistor T2 of the pull-up circuit 510b of the stage $S_{n+1}$, a source electrically coupled to the node K and a drain configured to receive a supply voltage VSS. The ninth transistor T9 has a gate electrically coupled to the input node $Q_n$, a source electrically coupled to the node K and a drain configured to receive the supply voltage VSS. The pull-down control circuit 540b includes a tenth transistor T10, an eleventh transistor T11 and a twelfth transistor T12. The tenth transistor T10 has a gate configured to receive the fourth clock signal XCK2, a source electrically coupled to the gate and a drain electrically coupled to a node P. The eleventh transistor T11 has a gate electrically coupled to the input node $Q_{n+1}$ or the gate of the second transistor T2 of the pull-up circuit 510b of the stage $S_{n+1}$, a source electrically coupled to the node P and a drain configured to receive a supply voltage VSS. The twelfth transistor T12 has a gate electrically coupled to the input node $Q_n$ or the gate of the first transistor T1 of the pull-up circuit 510a of the stage $S_n$, a source electrically coupled to the node P and a drain configured to receive the supply voltage VSS.

The pull-down circuit 530a has a thirteenth transistor T13 and a fourteenth transistor T14. The thirteenth transistor T13 has a gate electrically coupled to the node K of the pull-down control circuit 540a, a source electrically coupled to the input node $Q_n$ and a drain configured to receive the supply voltage VSS. The fourteenth transistor T14 has a gate electrically coupled to the node K of the pull-down control circuit 540a, a source electrically coupled to the output of the pull-up circuit 510a and a drain configured to receive the supply voltage VSS.

The pull-down circuit 530b has a fifteenth transistor T15 and a sixteenth transistor T16. The fifteenth transistor T15 has a gate electrically coupled to the node K of the pull-down control circuit 540a, a source electrically coupled to the input node $Q_{n+1}$ and a drain configured to receive the supply voltage VSS. The sixteenth transistor T16 has a gate electrically coupled to the node K of the pull-down control circuit 540a, a source electrically coupled to the output of the pull-up circuit 510b and a drain configured to receive the supply voltage VSS.

The pull-down circuit 530c has a seventeenth transistor T17 and an eighteenth transistor T18. The seventeenth transistor T17 has a gate electrically coupled to the node P of the pull-down control circuit 540b, a source electrically coupled to the input node $Q_n$ of the stage $S_n$ and a drain. The eighteenth transistor T18 has a gate electrically coupled to the node P of the pull-down control circuit 540b, a source electrically coupled to the input node of the stage $S_{n+1}$ or receiving the output signal $O_{n+1}$ therefrom and a drain electrically coupled to the drain of the seventeenth transistor T17.

The pull-down circuit 530d has a nineteenth transistor T19 and a twentieth transistor T20. The nineteenth transistor T19 has a gate electrically coupled to the node P of the pull-down control circuit 540b, a source electrically coupled to the output $Q_n$ of the stage $S_n$ and a drain configured to receive the supply voltage VSS. The twentieth transistor T20 has a gate electrically coupled to the node P of the pull-down control circuit 540b, a source electrically coupled to the output of the stage $S_{n+1}$ or receiving the output signal $O_{n+1}$ therefrom and a drain configured to receive the supply voltage VSS.

The key pull-down circuit 560a includes a twenty-first transistor T21 and a twenty-second transistor T22. The twenty-first transistor T21 has a gate electrically coupled to the output of the stage $S_{n+1}$ for receiving the output signal $O_{n+1}$ therefrom, a source electrically coupled to the input node $Q_n$ of the stage $S_n$ and a drain configured to receive the supply voltage VSS. The twenty-second transistor T22 has a gate electrically coupled to the output of the stage $S_{n+1}$ for receiving the output signal $O_{n+1}$ therefrom, a source electrically coupled to the output of the pull-up circuit 510a for receiving the output signal $O_n$ therefrom and a drain configured to receive the supply voltage VSS.

The key pull-down circuit 560b includes a twenty-third transistor T23 and a twenty-fourth transistor T24. The twenty-third transistor T23 has a gate electrically coupled to the output of the stage $S_{n+2}$ for receiving the output signal $O_{n+2}$ therefrom, a source electrically coupled to the gate of the sixteenth transistor T16 of the pull-down circuit 530b and a drain configured to receive the supply voltage VSS. The twenty-fourth transistor T24 has a gate electrically coupled to the output of the stage $S_{n+2}$ for receiving the output signal $O_{n+2}$ therefrom, a source electrically coupled to the output of the stage $S_{n+1}$ for receiving the output signal $O_{n+1}$ therefrom and a drain configured to receive the supply voltage VSS.

Additionally, the stage $S_n$ also includes a twenty-fifth transistor T25 and a twenty-sixth transistor T26. The twenty-fifth transistor T25 has a gate configured to receive the output signal $O_{n-2}$ of the (n−2)-th stage $S_{n-2}$, a source configured to receive the supply voltage VSS and a drain electrically coupled to the input node $Q_n$ or the gate of the first transistor T1 of the pull-up circuit 510a. The twenty-sixth transistor T26 has a gate configured to receive the output signal $O_{n+2}$ of the (n+2)-th stage $S_{n+2}$, a source configured to receive the supply voltage VSS and a drain electrically coupled to the input node $Q_n$ or the gate of the first transistor T1 of the pull-up circuit 510a. The stage $S_{n+1}$ also includes a twenty-seventh transistor T27 and a twenty-eighth transistor T28. The twenty-seventh transistor T27 has a gate configured to receive the output signal $O_{n+3}$ of the (n+3)-th stage $S_{n-2}$, a source configured to receive the supply voltage VSS and a drain electrically coupled to the input node $Q_{n+1}$ or the gate of the first transistor T2 of the pull-up circuit 510b. The twenty-eighth transistor T28 has a gate configured to receive the output signal $O_{n-1}$ of the (n−1)-th stage $S_{n-1}$, a source configured to receive the supply voltage VSS and a drain electrically coupled to the input node $Q_{n+1}$ or the gate of the first transistor T2 of the pull-up circuit 510b.

Figure 10:
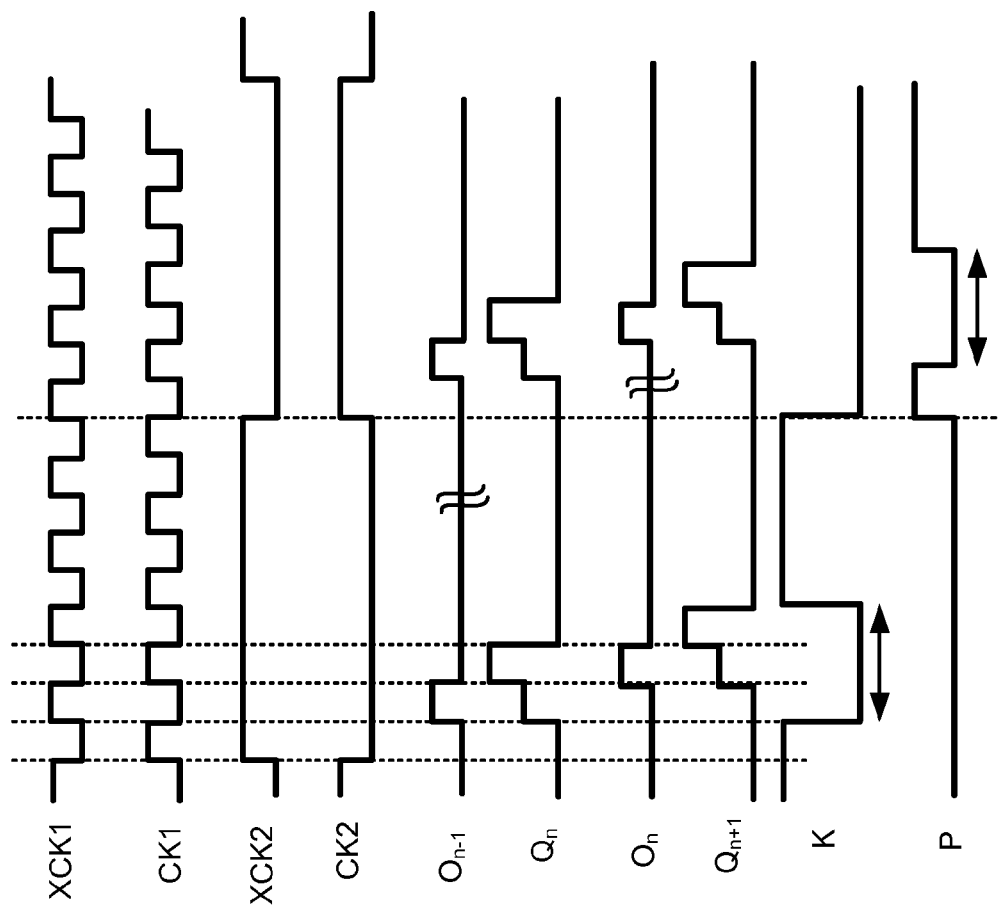
FIG. 10 shows a timing chart of input and output signals of the shift register as shown in FIG. 9.

FIG. 10 shows a timing chart of input and output signals for the shift register 500 shown in FIG. 9. The first, second, third and fourth clock signals, CK1, XCK1, CK2 and XCK2 are the input signals. Signals $O_n$ and $O_{n-1}$ are respectively the output signals from the stages $S_n$ and $S_{n-1}$, in response to the input signals received in the stages $S_n$ and $S_{n-1}$. Signals K and P is the voltage at the node K and P, respectively. Signals $Q_n$ and $Q_{n+1}$ are the voltage at the node $Q_n$ of the stages $S_n$ and the node $Q_{n+1}$ of the stages $S_{n+1}$, respectively.

Figure 11:
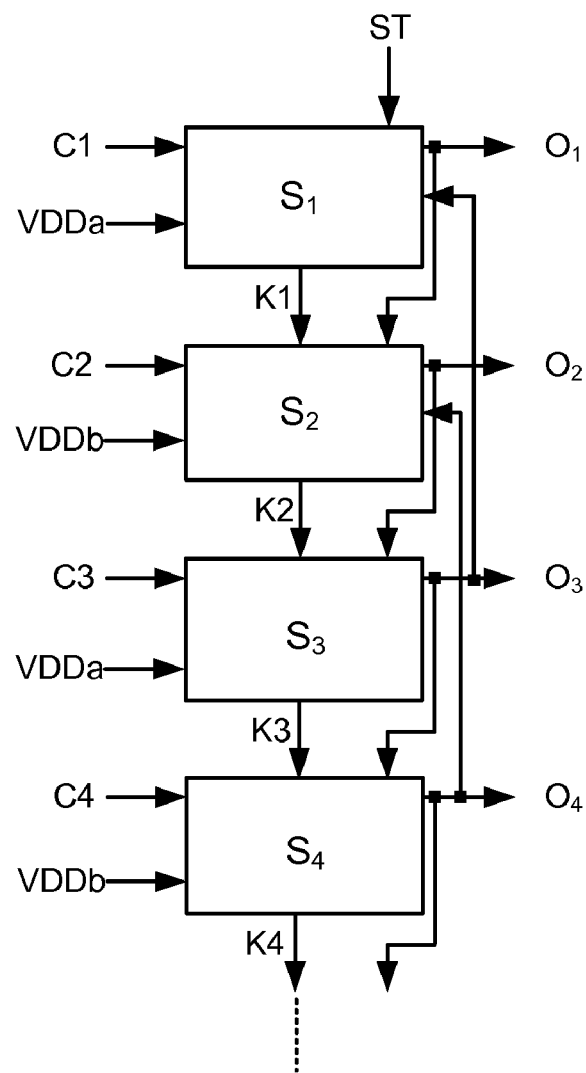
FIG. 11 shows a block diagram of a shift register according to one embodiments of the present invention.

Referring to FIG. 11, a shift register 600 is shown schematically according to one embodiment of the present invention. The shift register 600 has a plurality of stages, $\{S_n\}$, n=1, 2, . . . , N, where N can be any integer greater than 1. The plurality of stages $\{S_n\}$ is electrically connected in serial. In FIG. 11, only the first to fourth stages $S_1$, $S_2$, $S_3$ and $S_4$ of the shift register 600 are shown. Each of the stages $S_1$, $S_2$, $S_3$ and $S_4$ is configured to receive a corresponding clock signal, C1, C2, C3 or C4, and a supply voltage, VDDa or VDDb, and responsively output an output signal, $O_1$, $O_2$, $O_3$ or $O_4$. Furthermore, each stage $S_n$ is also configured to receive the output signal $O_{n-1}$ of the stage $S_{n-1}$ and the output signal $O_{n+2}$ of the stage $S_{n+2}$. For example, the stage $S_2$ is electrically connected to the stage $S_1$ and the stage $S_2$ for receiving the output signals O1 and O4 therefrom, respectively. For the first stage $S_1$, a start signal, ST, is applied thereto. Additionally, each stage $S_1$, $S_2$, $S_3$ or $S_4$ also outputs a corresponding pull-down signal $K_1$, $K_2$, $K_3$ or $K_4$, that is provided to its immediately next stage.

Figure 12:
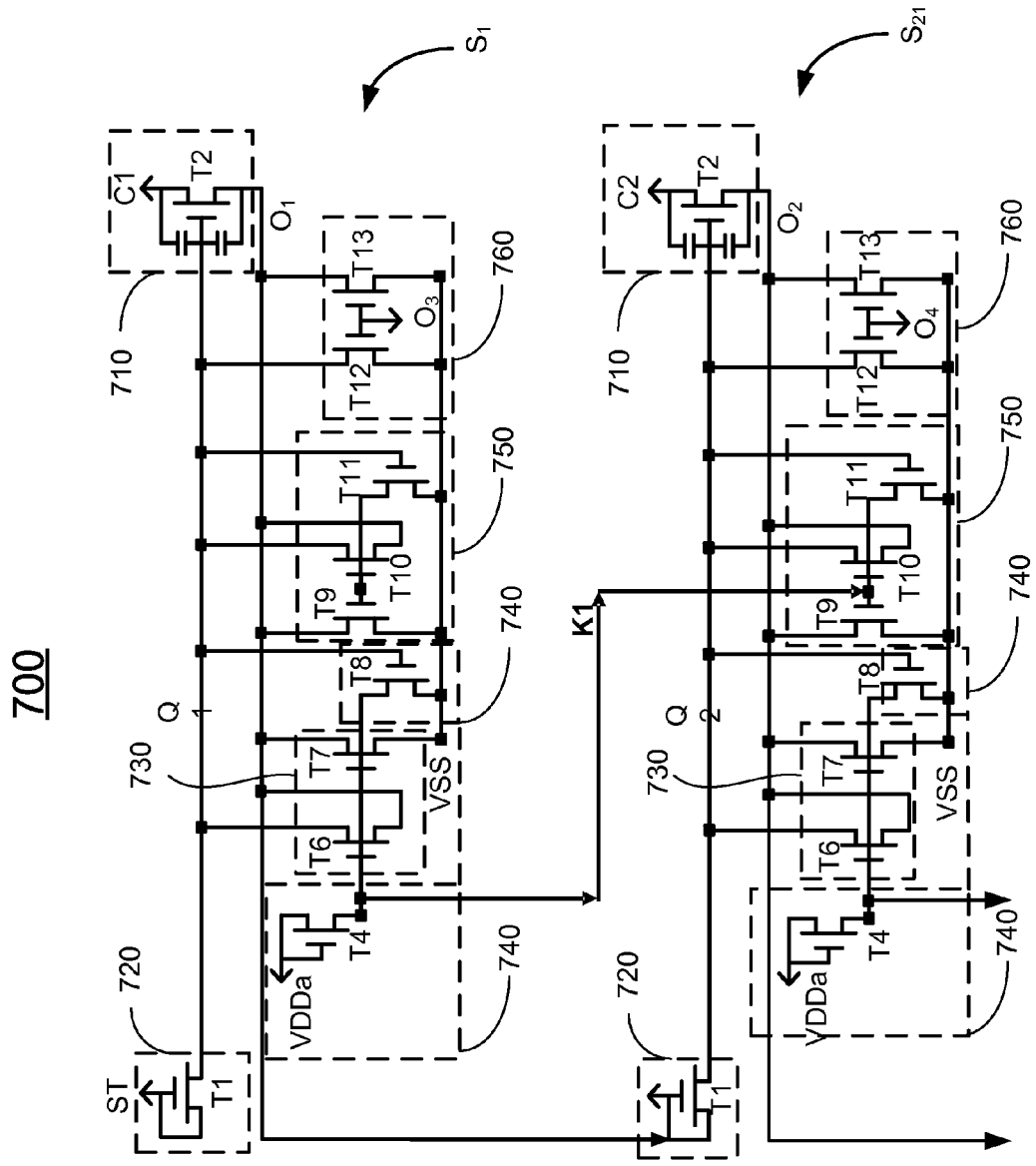
FIG. 12 shows a circuit diagram of two neighboring stages of a shift register according to another embodiment of the present invention.

FIG. 12 shows a circuit diagram of the first and second stages $S_1$, $S_2$ of a shift register 700 according to one embodiment of the present invention. Each stage $S_1$ or $S_2$ includes a pull-up circuit 710, a pull-up control circuit 720, a first pull-down circuit 730, a second pull-down circuit 750, a third pull-down circuit 760 and a first pull-down control circuit 740 electrically coupled to each other.

For the stage $S_1$, the pull-up circuit 710 is configured to receive a first clock signal C1 and responsively output an output signal, $O_1$. The pull-up control circuit 720 is configured such that when receiving the start signal ST, the pull-up control circuit 720 generates a signal that is provided to the pull-up circuit 710 to turn on the pull-up circuit 710. The first pull-down control circuit 740 is configured to receive the first supply voltage signal VDDa and responsively generate the pull-down signal $K_1$ that is provided to the first pull-down circuit 730 of this stage, and the second pull-down circuit 750 of the next stage $S_2$, respectively. The third pull-down circuit 760 of the stage $S_1$ is configured to receive the output signal $O_3$ of the stage $S_3$.

For the stage $S_2$, the pull-up circuit 710 is configured to receive a second clock signal C2 and responsively output an output signal, $O_2$. The pull-up control circuit 720 is configured such that when receiving the output signal $O_1$ of the stage $S_1$, the pull-up control circuit 720 generates a signal that is provided to the pull-up circuit 710 to turn on the pull-up circuit 710. The first pull-down control circuit 740 is configured to receive the second supply voltage signal VDDb and responsively generate the pull-down signal $K_2$ that is provided to the first pull-down circuit 730 of this stage, and the second pull-down circuit 750 of the next stage $S_3$, respectively. The second pull-down circuit 750 of the stage $S_2$ is configured to receive the pull-down signal $K_1$ of the stage $S_1$. The third pull-down circuit 760 is configured to receive the output signal $O_4$ of the stage $S_4$.

Specifically, for the stage $S_1$, the pull-up control circuit 720 has a first transistor T1 having a gate adapted for receiving the start pulse ST, a source electrically coupled to the gate and a drain electrically coupled to the node $Q_1$, as shown in FIG. 12.

The pull-up circuit 710 has a second transistor T2 having a gate electrically coupled to the node $Q_1$, a source adapted for receiving the first clock signal C1, and a drain electrically coupled to the output for outputting the stage output signal $O_1$ in response to the received first clock signal C1 in the source. Additionally, the pull-up circuit 710 also has two serial-connected capacitors are electrically coupled between the source and the drain of the second transistor T2.

The first pull-down control circuit 740 has a fourth transistor T4 having a gate adapted for receiving the first supply voltage signal VDDa, a source electrically coupled to the gate and a drain adapted for outputting the pull-down signal $K_1$, which is provided to the second pull-down circuit 750 of the stage $S_2$. The first pull-down control circuit 740 also has an eighth transistor T8 having a gate electrically coupled to the node $Q_1$ that is eclectically connected to the gate of the second transistor T2 of the pull-up circuit 710, a source electrically coupled to the drain of the fourth transistor T4 and a drain configured to receive the supply voltage VSS.

The first pull-down circuit 730 includes a sixth transistor T6 and a seventh transistor T7. The sixth transistor T6 has a gate electrically coupled to the drain of the fourth transistor T4 of the first pull-down control circuit 740, a source electrically coupled to the node $Q_1$ or the gate of the second transistor T2 of the pull-up circuit 710 and a drain electrically coupled to the drain of the second transistor T2 of the pull-up circuit 710. The seventh transistor T7 has a gate electrically coupled to the drain of the fourth transistor T4 of the first pull-down control circuit 740, a source electrically coupled to the drain of the second transistor T2 of the pull-up circuit 710 and a drain configured to receive the supply voltage VSS.

The second pull-down circuit 750 has a ninth transistor T9, a tenth transistor T10 and an eleventh transistor T11. The ninth transistor T9 has a gate, a source electrically coupled to the drain of the second transistor T2 of the pull-up circuit 710 and a drain configured to receive the supply voltage VSS. The tenth transistor T10 has a gate, a source electrically coupled to the node $Q_1$ or the gate of the second transistor T2 of the pull-up circuit 710 and a drain electrically coupled to the drain of the second transistor T2 of the pull-up circuit 710. The eleventh transistor T11 has a gate electrically coupled to the gate of the second transistor T2 of the pull-up circuit 710, a source electrically coupled to the fourth input IN4 and a drain configured to receive the supply voltage VSS.

The third pull-down circuit 760 has a twelfth transistor T12 and a thirteenth transistor T13. The twelfth transistor T12 has a gate adapted for receiving the output signal $O_3$ of the stage $S_3$, a source electrically coupled to the node $Q_1$ or the gate of the second transistor T2 of the pull-up circuit 710 and a drain configured to receive the supply voltage VSS. The thirteenth transistor T13 has a gate adapted for receiving the output signal $O_3$ of the stage $S_3$, a source electrically coupled to the drain of the second transistor T2 of the pull-up circuit 710 and a drain configured to receive the supply voltage VSS.

For the stage $S_2$, the circuit diagram is same as that of the stage $S_n$ except that the gate of the first transistor T1 of the pull-up control circuit 720 is adapted for receiving the output signal $O_1$ of the stage $S_1$. In the stage $S_2$, the source of the transistor T2 of the pull-up circuit 710 is configured to receive the second clock signal C2, and the gate of transistor T4 of the first pull-down control circuit 740 is configured to receive the second supply voltage signal VDDb. The gates of the transistors T12 and T13 of the third pull-down circuit 760 is configured to receive the output signal $O_4$ of the stage $S_4$. Additionally, the pull-down signal $K_1$ generated from the first pull-down control circuit 740 of the stage $S_1$ is provided to the gates of the transistors T9 and T10 of the second pull-down circuit 750 of the stage $S_2$.

Figure 13:
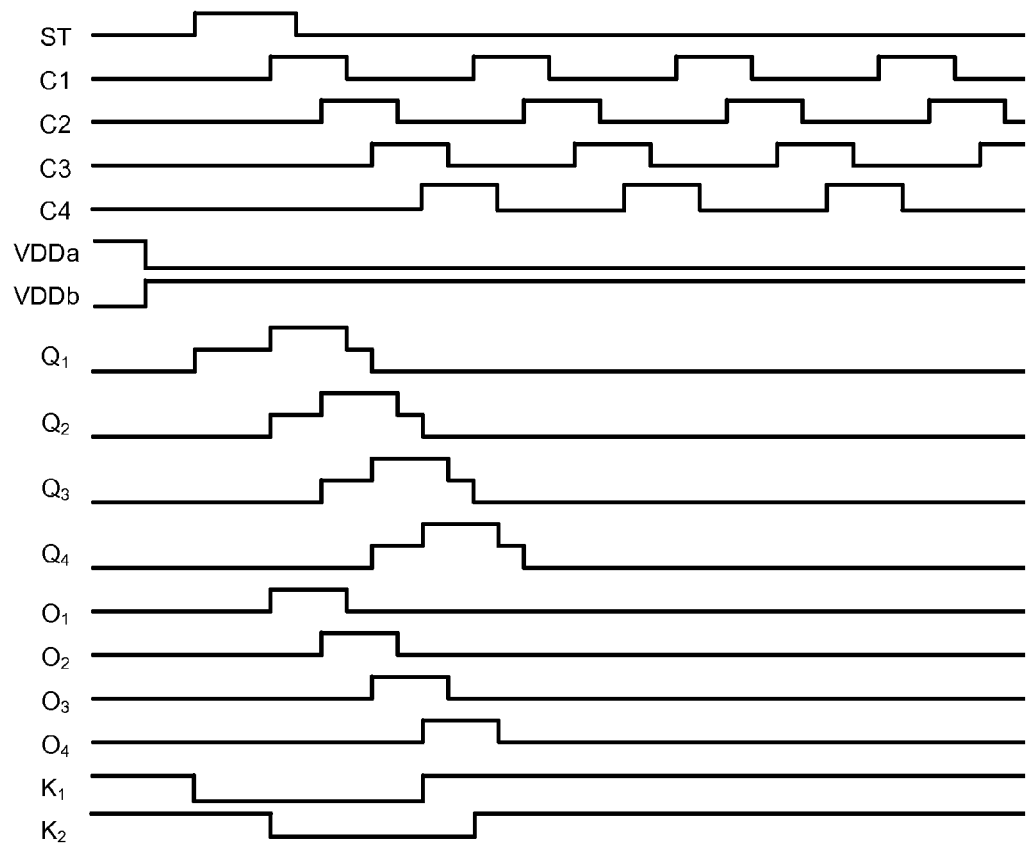
FIG. 13 shows a timing chart of input and output signals of the shift register as shown in FIG. 12.
Figure 13:
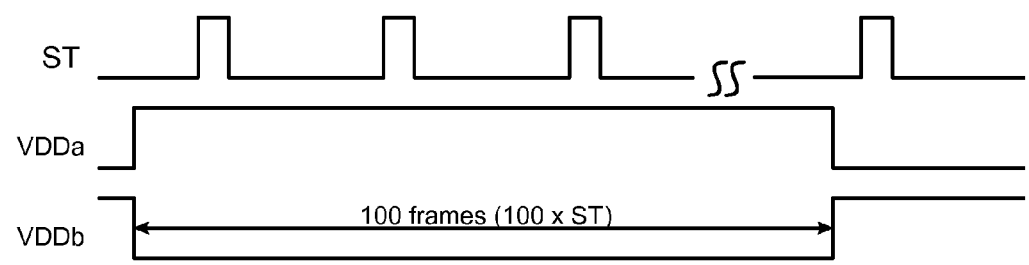

FIG. 13 shows a timing chart of input and output signals for the shift register as shown in FIG. 12. ST is the start signal that is provided to the gate of the transistor T1 of the pull-up control circuit 720 of the stage $S_1$. The clock signals C1, C2, C3 and C4 are provided to the source of the transistor T2 of the pull-up circuit 710 of the stages $S_1$, $S_2$, $S_3$ and $S_4$, respectively. The frequency of each of the clock signals C1, C2, C3 and C4 is identical, while the phase of each of the clock signals C1, C2, C3 and C4 is sequentially shifted from each other. The first supply voltage signal VDDa is provided to the gate of the transistor T4 of the first pull-down control circuit 740 of the stages $S_1$ and $S_3$, while the second supply voltage signal VDDb is provided to the gate of the transistor T4 of the first pull-down control circuit 740 of the stages $S_2$ and $S_4$. The frequencies of the first supply voltage signal VDDa and the second supply voltage signal VDDb are substantially identical, and the phases of the first supply voltage signal VDDa and the second supply voltage signal VDDb are substantially reversed, respectively.

Signals $O_1$, $O_2$, $O_3$ and $O_4$ are respectively the output signals from the stages $S_1$, $S_2$, $S_3$ and $S_4$. Signal $K_1$ and $K_2$ are the pull-down signal output from the first pull-down control circuit 740 of the stages $S_1$ or $S_2$. Signals $Q_1$, $Q_2$, $Q_3$ and $Q_4$ are the voltage potentials at the node $Q_1$ of the stage $S_1$, the node $Q_2$ of the stage $S_2$, the node $Q_3$ of the stage $S_3$ and the node $Q_4$ of the stage $S_4$, respectively.

Figure 14:
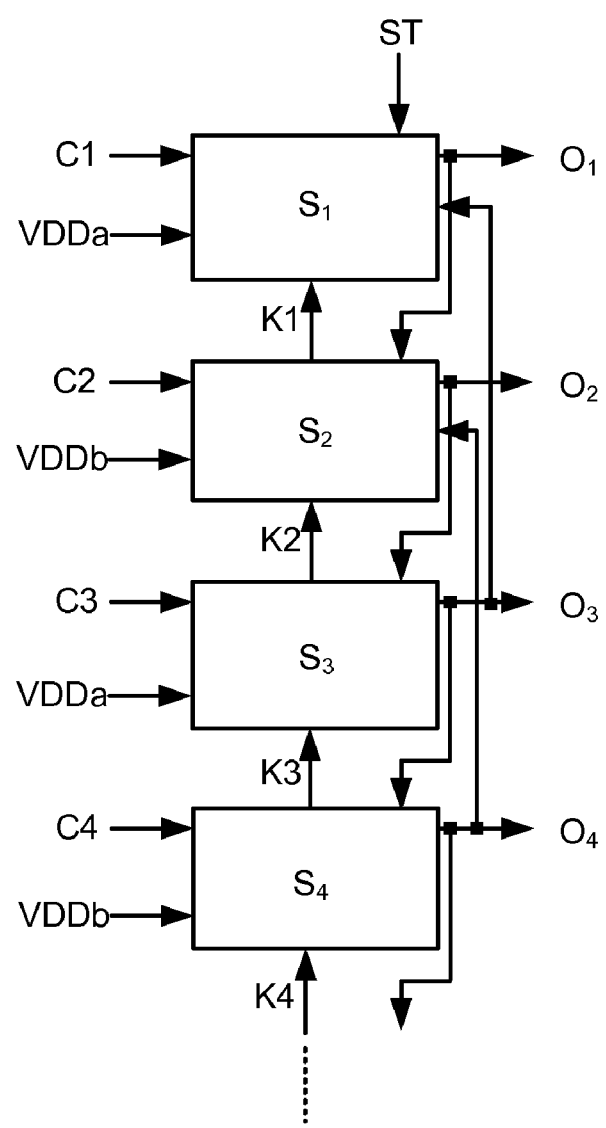
FIG. 14 shows a block diagram of a shift register according to one embodiments of the present invention.

FIG. 14 shows schematically a shift register 800 according to one embodiment of the present invention. Similar to the shift register 600 shown in FIG. 6, the shift register 800 has a plurality of stages, $\{S_n\}$, n=1, 2, ..., N, which is electrically connected in serial. Each of the stages $S_1$, $S_2$, $S_3$ and $S_4$ is configured to receive a corresponding clock signal, C1, C2, C3 or C4, and a supply voltage, VDDa or VDDb, and responsively output an output signal, $O_1$, $O_2$, $O_3$ or $O_4$. Furthermore, each stage $S_n$ is also configured to receive the output signal $O_{n-1}$ of the stage $S_{n-1}$ and the output signal $O_{n+2}$ of the stage $S_{n+2}$. For example, the stage $S_2$ is electrically connected to the stage $S_1$ and the stage $S_2$ for receiving the output signals O1 and O4 therefrom, respectively. For the first stage $S_1$, a start signal, ST, is applied thereto. However, in shift register 800, each stage $S_2$, $S_3$ or $S_4$ outputs a corresponding pull-down signal $K_1$, $K_2$ or $K_3$ that is fedback to its immediately prior stage.

Figure 15:
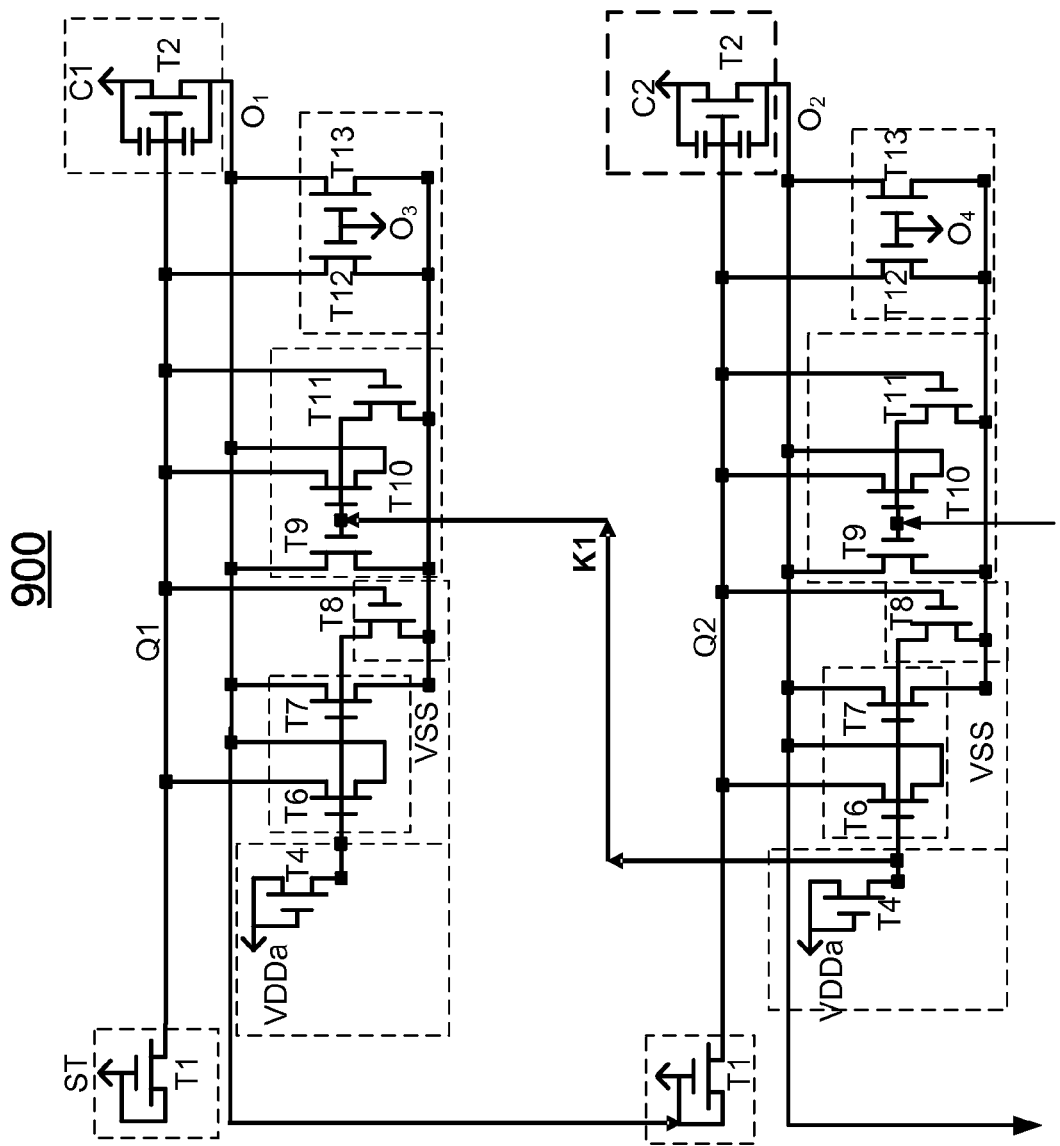
FIG. 15 shows a circuit diagram of two neighboring stages of a shift register according to another embodiment of the present invention.

FIG. 15 shows a circuit diagram of the first and second stages $S_1$, $S_2$ of a shift register 900 according to one embodiment of the present invention. The circuit of the shift register 900 is same as that of shift register 700 as shown in FIG. 12, except that the pull-down signal $K_1$ generated from the first pull-down control circuit of the stage $S_2$ is provided to the gates of the transistors T9 and T10 of the second pull-down circuit of the stage $S_1$. For such a configuration, the timing chart of input and output signals for the shift register 900 are same these shown in FIG. 13.

Figure 16:
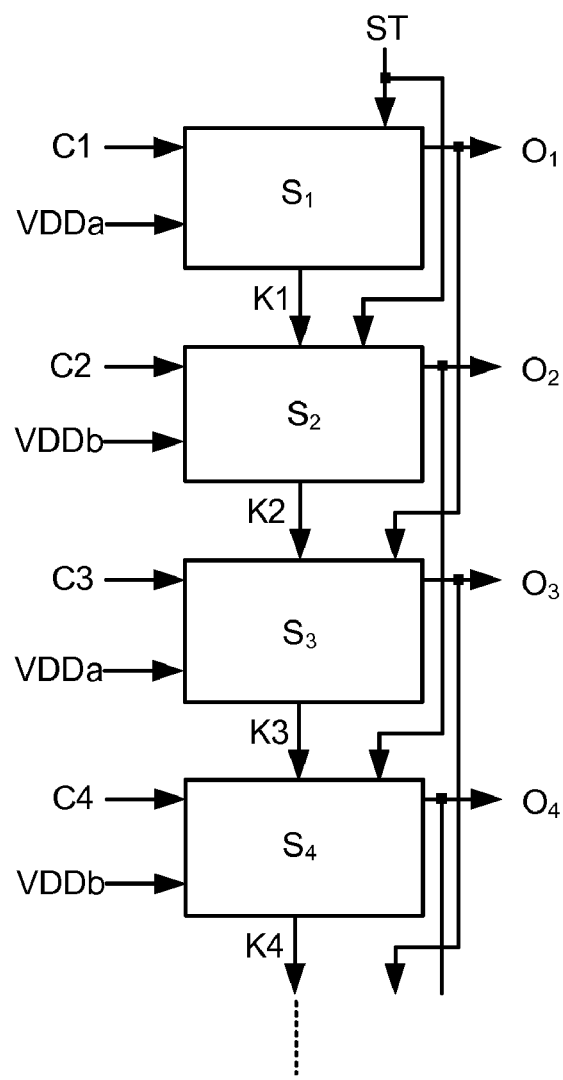
FIG. 16 shows a block diagram of a shift register according to one embodiments of the present invention.

Referring to FIG. 16, a shift register 1000 is shown schematically according to one embodiment of the present invention. The shift register 1000 has a plurality of stages, $\{S_n\}$, electrically connected in serial. In FIG. 16, only the first to fourth stages $S_1$, $S_2$, $S_3$ and $S_4$ of the shift register 1000 are shown. Each of the stages $S_1$, $S_2$, $S_3$ and $S_4$ is configured to receive a corresponding clock signal, C1, C2, C3 or C4, and a supply voltage, VDDa or VDDb, and responsively output an output signal, $O_1$, $O_2$, $O_3$ or $O_4$. Furthermore, the stage $S_n$ is also configured to receive the output signal $O_{n-2}$ of the stage $S_{n-2}$, (n=3 and 4). For example, the stage $S_3$ is electrically connected to the stage $S_1$ for receiving the output signal $O_1$ therefrom. For the first and second stages $S_1$ and $S_3$, a start signal ST is applied thereto. Additionally, each stage $S_1$, $S_2$, $S_3$ or $S_4$ also outputs a corresponding pull-down signal $K_1$, $K_2$, $K_3$ or $K_4$, that is provided to its immediately next stage.

Figure 17:
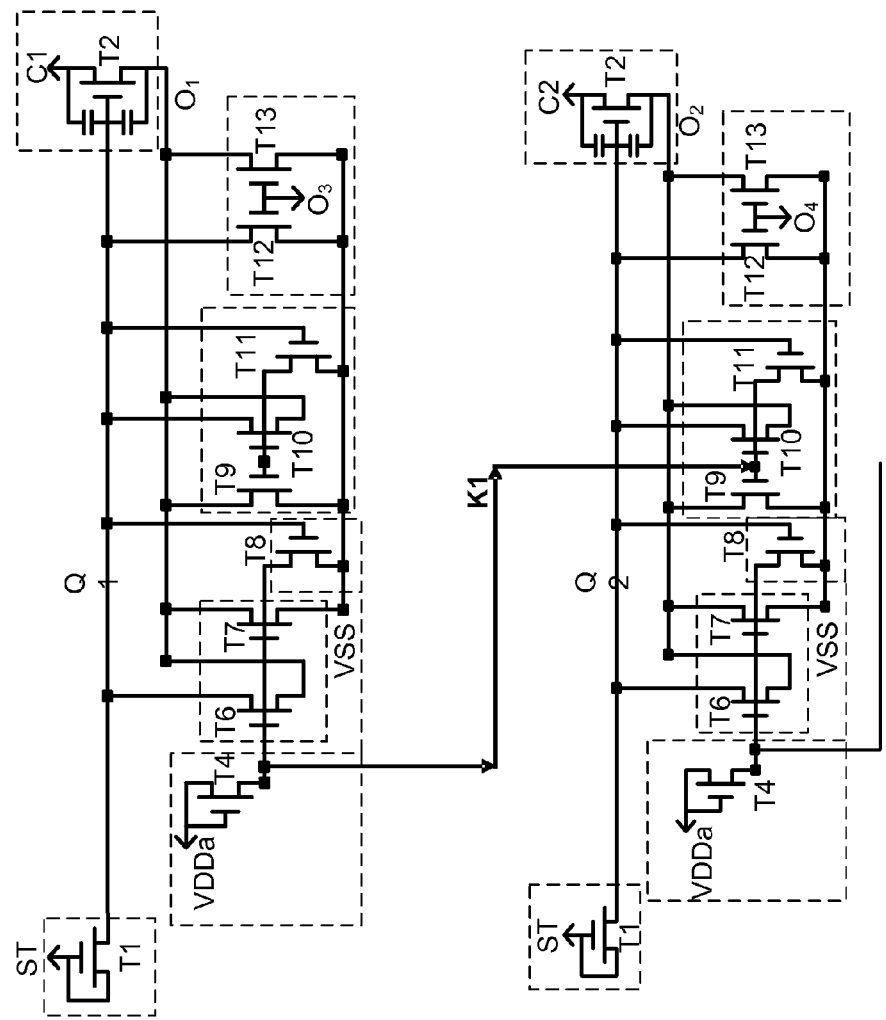
FIG. 17 shows a circuit diagram of two neighboring stages of a shift register according to another embodiment of the present invention.

FIG. 17 shows a circuit diagram of the first and second stages $S_1$, $S_2$ of a shift register 1100 according to an alternative embodiment of the present invention. The circuit of the shift register 1100 is same as that of shift register 700 as shown in FIG. 12, except that the start signal ST is applied to the gate of the transistor T1 of the pull-up control circuit of the stage $S_1$ and $S_2$, respectively. For n=3, 4, 5, ..., N, the output signal $O_{n-2}$ is provided to the stage $S_{n-2}$ is provided to the gate of the transistor T1 of the pull-up control circuit of the stage $S_n$.

Figure 18:
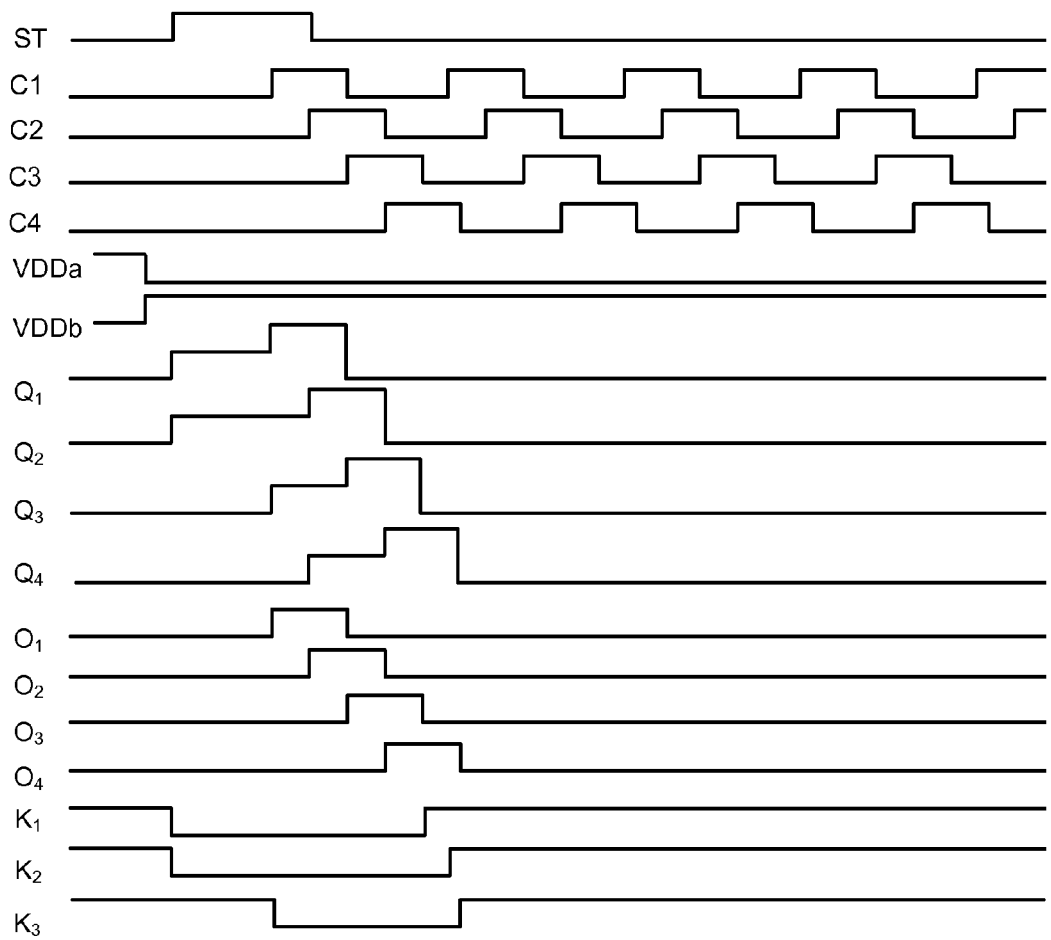
FIG. 18 shows a timing chart of input and output signals of the shift register as shown in FIG. 17.
Figure 18:
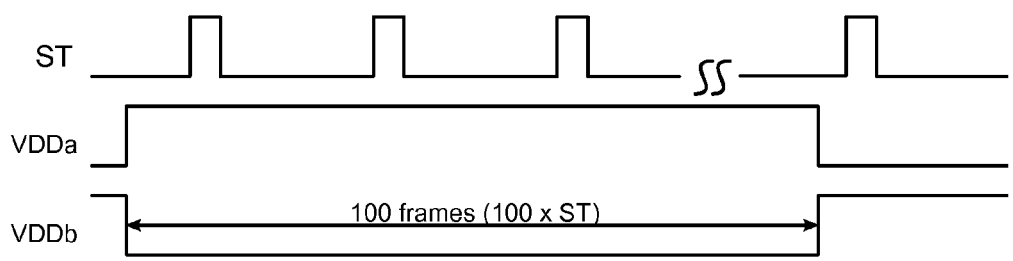

FIG. 18 shows a timing chart of input and output signals for the shift register 1100 as shown in FIG. 17. ST is the start signal that is provided to the gate of the transistor T1 of the pull-up control circuit of the stage $S_1$. The clock signals C1, C2, C3 and C4 are provided to the source of the transistor T2 of the pull-up circuit of the stages $S_1$, $S_2$, $S_3$ and $S_4$, respectively. The frequency of each of the clock signals C1, C2, C3 and C4 is identical, while the phase of each of the clock signals C1, C2, C3 and C4 is sequentially shifted from each other. The first supply voltage signal VDDa is provided to the gate of the transistor T4 of the first pull-down control circuit of the stages $S_1$ and $S_3$, while the second supply voltage signal VDDb is provided to the gate of the transistor T4 of the first pull-down control circuit of the stages $S_2$ and $S_4$. The frequencies of the first supply voltage signal VDDa and the second supply voltage signal VDDb are substantially identical, and the phases of the first supply voltage signal VDDa and the second supply voltage signal VDDb are substantially reversed, respectively.

Signals $O_1$, $O_2$, $O_3$ and $O_4$ are respectively the output signals from the stages $S_1$, $S_2$, $S_3$ and $S_4$. Signal $K_1$, $K_2$ and $K_2$ are the pull-down signal output from the first pull-down control circuit of the stages $S_1$ $S_2$ and $S_2$. Signals $Q_1$, $Q_2$, $Q_3$ and $Q_4$ are the voltage potentials at the node $Q_1$ of the stage $S_1$, the node $Q_2$ of the stage $S_2$, the node $Q_3$ of the stage $S_3$ and the node $Q_4$ of the stage $S_4$, respectively.

Figure 19:
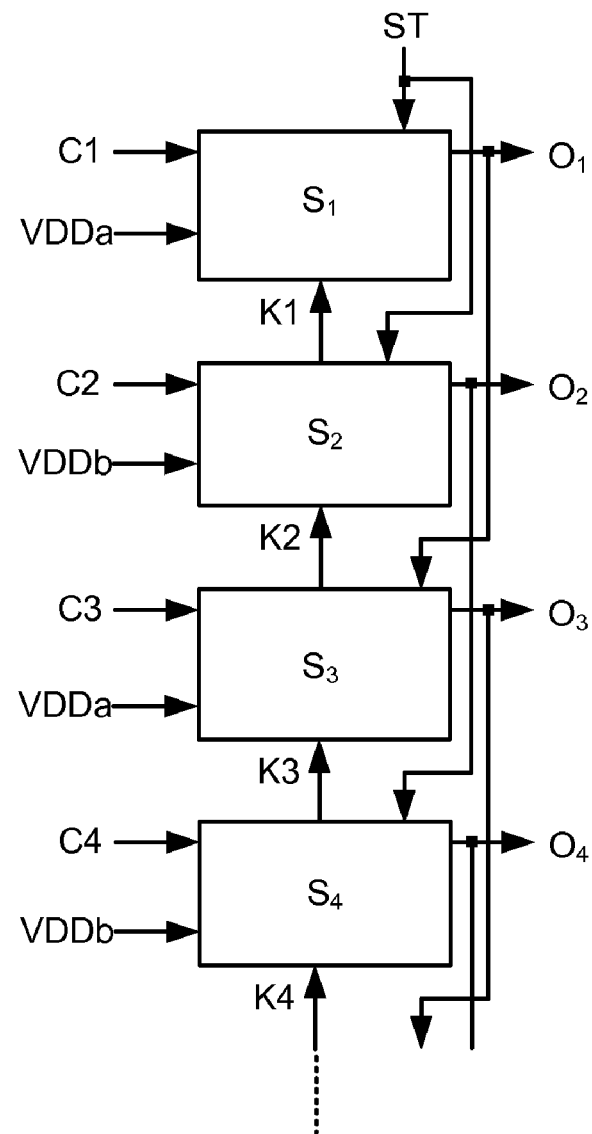
FIG. 19 shows a block diagram of a shift register according to one embodiments of the present invention.

Referring to FIG. 19, a shift register 1200 is shown schematically according to one embodiment of the present invention. Similar to the shift register 1000 as shown in FIG. 16, the shift register 1200 has four stages $S_1$, $S_2$, $S_3$ and $S_4$, which are electrically connected in serial. Each of the stages $S_1$, $S_2$, $S_3$ and $S_4$ is configured to receive a corresponding clock signal, C1, C2, C3 or C4, and a supply voltage, VDDa or VDDb, and responsively output an output signal, $O_1$, $O_2$, $O_3$ or $O_4$. Furthermore, the stage $S_n$ is also configured to receive the output signal $O_{n-2}$ of the stage $S_{n-2}$, (n=3 and 4). For example, the stage $S_3$ is electrically connected to the stage $S_1$ for receiving the output signal O1 therefrom. For the first and second stages $S_1$ and $S_3$, a start signal ST is applied thereto. However, in the shift register 1200, each stage $S_1$, $S_2$, $S_3$ or $S_4$ outputs a corresponding pull-down signal $K_1$, $K_2$, $K_3$ or $K_4$, that is fedback to its immediately prior stage.

Figure 20:
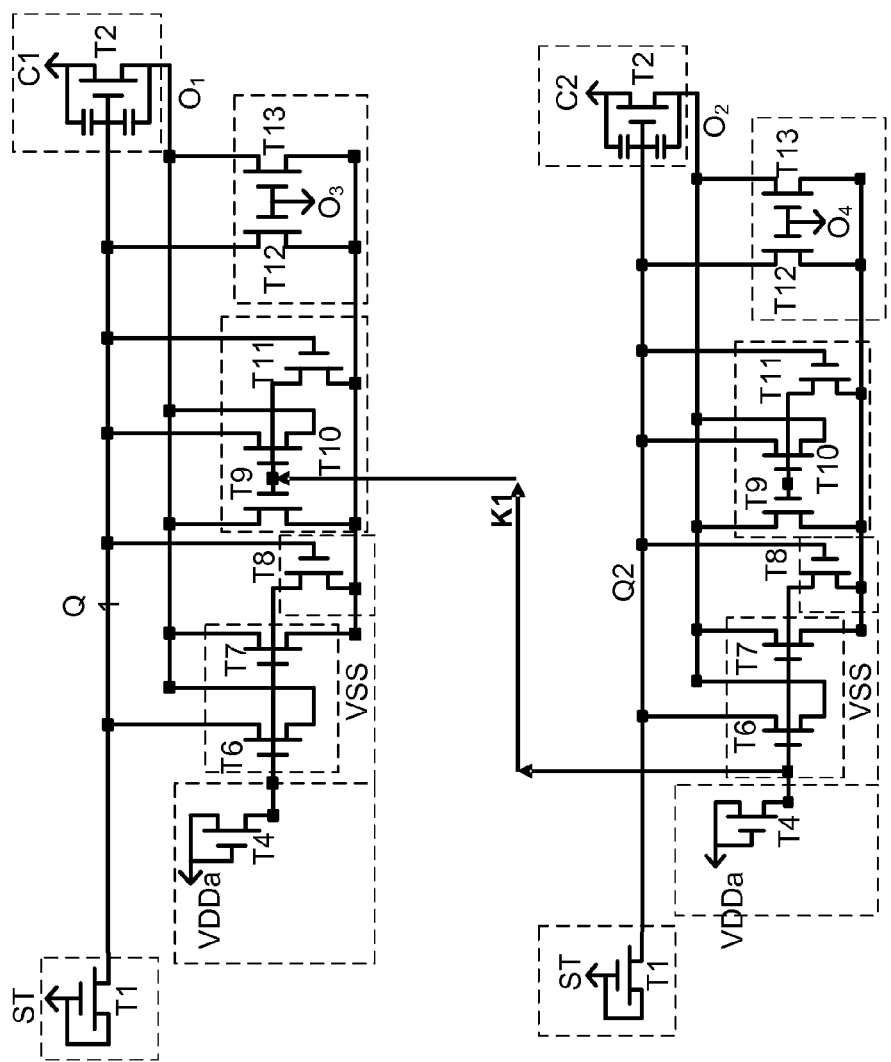
FIG. 20 shows a circuit diagram of two neighboring stages of a shift register according to another embodiment of the present invention.

FIG. 20 shows a circuit diagram of the first and second stages $S_1$, $S_2$ of a shift register 1300 according to another embodiment of the present invention. The circuit of the shift register 1200 is same as that of shift register 1100 as shown in FIG. 17, except that the pull-down signal $K_1$ generated from the first pull-down control circuit of the stage $S_2$ is provided to the gates of the transistors T9 and T10 of the second pull-down circuit of the stage $S_1$. For such a configuration, the timing chart of input and output signals for the shift register are same these shown in FIG. 18.

In sum, the present invention, among other things, discloses a shift register having a plurality of stages, $\{S_n\}$, n=1, 2, ..., N, N being a positive integer. Each pair of two neighboring stages $S_n$ and $S_{n+1}$ or $S_{n-1}$ and $S_n$ shares a single pull-down control circuit, Accordingly, it simplifies the GOA design and reduces the manufacturing cost of an LCD panel. Furthermore, it can reduce the stress and improves the reliability of operation of the LCD panel.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated.

Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A shift register, comprising a plurality of stages, $\{S_n\}$, n=1, 2, ..., N, N being a positive integer, wherein each stage $S_n$ comprises:
   (a) a pull-up circuit having an input for receiving a first clock signal, CK1, an output for responsively outputting an output signal, $O_n$, and an input node $Q_n$;
   (b) a pull-up control circuit electrically coupled to the input node $Q_n$ of the pull-up circuit and configured such that when receiving a first input signal, the pull-up control circuit responsively generates a signal that is provided to the input node $Q_n$ of the pull-up circuit to turn on the pull-up circuit;
   (c) a pull-down circuit electrically coupled to the input node $Q_n$ of the pull-up circuit and configured to provide a first voltage to one of the input node $Q_n$ and the output of the pull-up circuit; and
   (d) a pull-down control circuit configured to receive one of a third clock signal, CK2, and a fourth clock signal, XCK2, and responsively generate the first voltage to turn on the pull-down circuit of the stage $S_n$ and the pull-down circuit of the stage $S_{n+1}$; and
   (e) a key pull-down circuit electrically coupled to the pull-down circuit and configured to receive a second input signal.

2. The shift register of claim 1, wherein the first input signal is corresponding to the output signal $O_{n-1}$ of the stage $S_{n-1}$, and wherein the second input signal is corresponding to the output signal $O_{n+1}$ of the stage $S_{n+1}$.

3. The shift register of claim 1, wherein the pull-up circuit comprises a first transistor T1 having a gate electrically coupled to the input node $Q_n$, a source electrically coupled to the input for receiving one of the first clock signal CK1 and the second clock signal XCK1 and a drain electrically coupled to the output for outputting the output signal $O_n$.

4. The shift register of claim 2, wherein the pull-up control circuit comprises:
   (a) a third transistor T3 having a gate, a source electrically coupled to the output of the stage $S_{n-1}$ for receiving the output signal $O_{n-1}$ therefrom and a drain electrically coupled to the input node $Q_n$ of the pull-up circuit; and
   (b) a fourth transistor T4 having gate electrically coupled to the input node $Q_{n-1}$ of the pull-up circuit of the stage $S_{n-1}$, a source configured to receive the second clock signal XCK1 when the input of the pull-up circuit receives the first clock signal CK1 or the first clock signal CK1 when the input of the pull-up circuit receives the second clock signal XCK1 and a drain electrically coupled to the gate of the third transistor T3.

5. The shift register of claim 4, wherein the pull-down control circuit comprises:
   (a) a seventh transistor T7 having a gate configured to receive a third clock signal CK2, a source electrically coupled to the gate and a drain electrically coupled to a node K;
   (b) an eighth transistor T8 having a gate electrically coupled to the input node $Q_n$ of the pull-up circuit of the stage $S_{n-1}$, a source electrically coupled to the node K and a drain configured to receive a supply voltage VSS; and
   (c) a ninth transistor T9 having a gate electrically coupled to the input node $Q_n$ of the pull-up circuit, a source electrically coupled to the node K and a drain configured to receive the supply voltage VSS.

6. The shift register of claim 5, wherein the pull-down circuit comprises:
   (a) a thirteenth transistor T13 having a gate electrically coupled to the node K of the pull-down control circuit, a source electrically coupled to the input node $Q_n$ and a drain configured to receive the supply voltage VSS; and
   (b) a fourteenth transistor T14 having a gate electrically coupled to the node K of the pull-down control circuit, a source electrically coupled to the output of the pull-up circuit and a drain configured to receive the supply voltage VSS.

7. The shift register of claim 6, wherein the key pull-down circuit comprises:
   (a) a twenty-first transistor T21 having a gate electrically coupled to the output of the stage $S_{n+1}$ for receiving the output signal $O_{+1}$ therefrom, a source electrically coupled to the input node $Q_n$ of the pull-up circuit and a drain configured to receive the supply voltage VSS; and
   (b) a twenty-second transistor T22 having a gate electrically coupled to the output of the stage $S_{n+1}$ for receiving the output signal $O_{n+1}$ therefrom, a source electrically coupled to the output of the pull-up circuit and a drain configured to receive the supply voltage VSS.

8. The shift register of claim 7, wherein each stage $S_n$ further comprises:
   (a) a twenty-fifth transistor T25 having a gate configured to receive the output signal $O_{n-2}$ of the (n−2)-th stage $S_{n-2}$, a source configured to receive the supply voltage VSS and a drain electrically coupled to the input node $Q_n$, of the pull-up circuit; and
   (b) a twenty-sixth transistor T26 having a gate configured to receive the output signal $O_{n+2}$ of the (n+2)-th stage $S_{n+2}$, a source configured to receive the supply voltage VSS and a drain electrically coupled to the input node $Q_n$, of the pull-up circuit.

* * * * *